(12) United States Patent
Kawai et al.

(10) Patent No.: US 7,911,824 B2
(45) Date of Patent: Mar. 22, 2011

(54) NONVOLATILE MEMORY APPARATUS

(75) Inventors: Ken Kawai, Osaka (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 173 days.

(21) Appl. No.: 12/445,383

(22) PCT Filed: Jul. 29, 2008

(86) PCT No.: PCT/JP2008/002020
§ 371 (c)(1),
(2), (4) Date: Apr. 13, 2009

(87) PCT Pub. No.: WO2009/016824
PCT Pub. Date: Feb. 5, 2009

(65) Prior Publication Data
US 2010/0103723 A1    Apr. 29, 2010

(30) Foreign Application Priority Data

Aug. 1, 2007  (JP) .................. 2007-200620

(51) Int. Cl.
*G11C 11/00*    (2006.01)
(52) U.S. Cl. .................. 365/148; 365/189.04; 365/158; 365/163; 365/171; 365/173
(58) Field of Classification Search .................. 365/148, 365/158, 163, 171, 173, 189.04, 189.15
See application file for complete search history.

(56) References Cited

U.S. PATENT DOCUMENTS

| 7,095,644 B2 | 8/2006 | Chevallier et al. |
| 2004/0037110 A1* | 2/2004 | Ooishi ..................... 365/171 |
| 2004/0042292 A1 | 3/2004 | Sakata et al. |
| 2005/0237820 A1* | 10/2005 | Takemura et al. ....... 365/189.05 |
| 2006/0126380 A1 | 6/2006 | Osada et al. |
| 2006/0158919 A1 | 7/2006 | Inaba |
| 2008/0151656 A1* | 6/2008 | Nakai ..................... 365/189.16 |

FOREIGN PATENT DOCUMENTS

| JP | 2004-086986 | 3/2004 |
| JP | 2004-185756 | 7/2004 |
| JP | 2004-234707 | 8/2004 |

(Continued)

OTHER PUBLICATIONS

Fujimoto, Masayuki et al., "High-Speed Resistive Switching of $TiO_2$/TiN Nano-Crystalline Thin Film," Japanese Journal of Applied Physics, vol. 45, No. 11, pp. L310-L312, 2006.

(Continued)

*Primary Examiner* — Vu A Le
*Assistant Examiner* — Han Yang
(74) *Attorney, Agent, or Firm* — McDermott Will & Emery LLP

(57) ABSTRACT

Provided are a plurality of memory cell arrays 136 and 146 each having a plurality of nonvolatile memory elements having a characteristic whose resistance value changes according to electric pulses applied, and control units (102, 104, 108, 110, 114, 128, 130, 152) configured to write data to a memory cell array and to read data from another memory cell array such that writing of the data and reading of the data occur concurrently in writing of the data to the plurality of memory cell arrays.

12 Claims, 18 Drawing Sheets

FOREIGN PATENT DOCUMENTS

| | | |
|---|---|---|
| JP | 2005-108395 | 4/2005 |
| JP | 2006-031795 | 2/2006 |
| JP | 2006-134398 | 5/2006 |
| JP | 2006-155700 | 6/2006 |
| JP | 2006-164511 | 6/2006 |
| JP | 2006-185577 | 7/2006 |
| JP | 2007-226884 | 9/2007 |

OTHER PUBLICATIONS

Baek, I.G. et al., "Highly Scalable Non-volatile Resistive Memory using Simple Binary Oxide Driven by Asymmetric Unipolar Voltage Pulses," Samsung Advanced Institute of Technology, 2004 IEEE.

* cited by examiner

| DI | SAO | HRE | LRE |
|----|-----|-----|-----|
| L  | L   | L   | L   |
| L  | H   | H   | L   |
| H  | L   | L   | H   |
| H  | H   | L   | L   |

| PERIOD | DQ | AD | READ VALUE | DATA INPUT/OUTPUT CIRCUIT ||||||| CONTROL CIRCUIT ||||
| | | | | WRITE DATA LATCH || READ DATA LATCH || ADDRESS LATCH || CONTROL FOR FIRST BANK || CONTROL FOR SECOND BANK ||
| | VALUE OF DI | VALUE OF AD | VALUE OF SAO | VALUE OF DL1 | VALUE OF DL2 | VALUE OF RL1 | VALUE OF RL2 | VALUE OF AL1 | VALUE OF AL2 | WRITE ADDRESS | READ ADDRESS | WRITE ADDRESS | READ ADDRESS |
|---|---|---|---|---|---|---|---|---|---|---|---|---|---|
| 1 | D1 | A1 | R1 | →D1 | – | →R1 | – | →A1 | – | – | A1 | – | – |
| 2 | D2 | A2 | R2 | D1→ | →D2 | R1→ | →R2 | A1→ | →A2 | A1 | – | – | A2 |
| 3 | D3 | A3 | R3 | →D3 | D2→ | →R3 | R2→ | →A3 | A2→ | – | A3 | A2 | – |
| 4 | D4 | A4 | R4 | D3→ | →D4 | R3→ | →R4 | A3→ | →A4 | A3 | – | – | A4 |

Fig. 8

| PERIOD | DQ VALUE OF DI | AD VALUE OF AD | VALUE READ IN ADVANCE VALUE OF SAOR | VALUE READ FOR VERIFICATION VALUE OF SAOV | DATA INPUT/OUTPUT CIRCUIT | | | | | | | | ADDRESS LATCH | | | | CONTROL CIRCUIT | | | | | | | |
|---|---|---|---|---|---|---|---|---|---|---|---|---|---|---|---|---|---|---|---|---|---|---|---|---|
| | | | | | WRITE DATA LATCH | | | | READ DATA LATCH | | | | | | | | CONTROL FOR FIRST BANK | | CONTROL FOR SECOND BANK | | CONTROL FOR THIRD BANK | | CONTROL FOR FOURTH BANK | |
| | | | | | VALUE OF DL1 | VALUE OF DL2 | VALUE OF DL3 | VALUE OF DL4 | VALUE OF RL1 | VALUE OF RL2 | VALUE OF RL3 | VALUE OF RL4 | VALUE OF AL1 | VALUE OF AL2 | VALUE OF AL3 | VALUE OF AL4 | WRITE ADDRESS | READ ADDRESS | WRITE ADDRESS | READ ADDRESS | WRITE ADDRESS | READ ADDRESS | WRITE ADDRESS | READ ADDRESS |
| 1 | D1 | A1 | R1 | - | →D1 | - | - | - | →R1 | - | - | - | →A1 | - | - | - | - | A1 | - | - | - | - | - | - |
| 2 | D2 | A2 | R2 | - | D1↑ | →D2 | - | - | R1↑ | →R2 | - | - | A1↑ | →A2 | - | - | A1 | - | - | - | - | - | - | - |
| 3 | D3 | A3 | R3 | V1 | D1 | D2↑ | →D3 | - | →V1 | R2↑ | →R3 | - | A1↑ | A2↑ | →A3 | - | - | A1 | A2 | - | - | - | - | - |
| 4 | D4 | A4 | R4 | V2 | D1↑ | D2 | D3↑ | →D4 | V1↑ | →V2 | R3↑ | →R4 | A1↑ | A2↑ | A3↑ | →A4 | - | - | - | A2 | - | A3 | - | - |
| 5 | D5 | A5 | R5 | V3 | →D5 | D2↑ | D3 | D4↑ | →R5 | V2↑ | →V3 | R4↑ | →A5 | A2↑ | A3↑ | A4↑ | A5 | - | A2 | - | A3 | - | A4 | - |
| 6 | D6 | A6 | R6 | V4 | D5↑ | →D6 | D3↑ | D4 | R5↑ | →R6 | V3↑ | →V4 | A5↑ | →A6 | A3↑ | A4↑ | - | A5 | - | - | - | A3 | - | A4 |
| 7 | D7 | A7 | R7 | V5 | D5 | D6↑ | →D7 | D4↑ | →V5 | R6↑ | →R7 | V4↑ | A5↑ | A6↑ | →A7 | A4↑ | A5 | - | A6 | - | - | - | - | - |
| 8 | D8 | A8 | R8 | V6 | D5↑ | D6 | D7↑ | →D8 | V5↑ | →V6 | R7↑ | →R8 | A5↑ | A6↑ | A7↑ | →A8 | - | A5 | - | A6 | A7 | - | - | A8 |

Fig. 14

NONVOLATILE MEMORY APPARATUS

RELATED APPLICATIONS

This application is the U.S. National Phase under 35 U.S.C. §371 of International Application No. PCT/JP2008/002020, filed on Jul. 29, 2008, which in turn claims the benefit of Japanese Application No. 2007-200620, filed on Aug. 1, 2007, the disclosures of which Applications are incorporated by reference herein.

TECHNICAL FIELD

The present invention relates to a nonvolatile memory apparatus. More particularly, the present invention relates to a nonvolatile memory apparatus using a nonvolatile memory element whose resistance state changes according to electric signals applied.

BACKGROUND ART

Non-patent document 1 discloses a resistive random access memory apparatus as the conventional nonvolatile memory apparatus. In the resistive random access memory apparatus, a negative pulse (voltage: −2.0V, pulse width: 20 ns) is applied to change a memory cell using $TiO_2$/TiN as a resistance variable element to a low-resistance state (about 200Ω, "1" data), while a positive pulse (voltage: 2.2V, pulse width: 30 ns) is applied to change the memory cell to a high-resistance state (about 80 kΩ, "0" data).

FIG. 16 is a view showing change in a resistance state in the case where positive and negative pulses are applied alternately in the resistive random access memory apparatus disclosed in the non-patent document 1. By applying the positive and negative pulses alternately in this way, the resistance variable element transitions between a high-resistance state HR and a low-resistance state LR substantially stably.

The patent document 1 discloses the conventional resistive random access memory apparatus which attains the operation of the RAM type on premise that the resistance state changes in response to one pulse. In the resistive random access memory apparatus, during writing of data, two kinds of cycles, i.e, a cycle for applying a high-resistance state attaining pulse and a cycle for applying a low-resistance state attaining pulse are executed. To be specific, the high-resistance state attaining pulse is applied once to a cell which is desired to change its resistance state to the high-resistance state and the low-resistance state attaining pulse is applied once to a cell which is desired to change its resistance state to the low-resistance state in a subsequent cycle, so that desired data is written to the cell.

FIG. 17 is a view showing a current-voltage characteristic of the resistance variable element using TMO (transition metal oxide) disclosed in non-patent document 2. As can be seen from the current-voltage characteristic of FIG. 17, the resistive random access memory element using the TMO is capable of transitioning between a high-resistance state and a low-resistance state alternately regardless of whether voltages of different polarities are applied or voltages of the same polarity are applied. Hereinafter, a case where the resistance state of the resistive random access memory element is switched using two kinds of positive voltages will be described. In "SET" in which the high-resistance state is changed to the low-resistance state, a low-resistance state attaining voltage is applied at a first predetermined positive current value using a set current compliance to prevent break of the element due to an increased current, causing the element to transition from the high-resistance state to the low-resistance state. In "RESET" in which the low-resistance state is changed to the high-resistance state, a high-resistance state attaining voltage is applied, so that a second positive current larger than the first positive current flows in the element, causing the element to transition from the low-resistance state to the high-resistance state.

To solve such a problem, in the nonvolatile memory apparatus disclosed in patent document 2, the memory cell is caused to transition to a low-resistance state (delete) prior to writing of data. After deleting the data, a high-resistance state attaining pulse is applied while checking the resistance state of each memory cell, and reading of the resistance state and application of the high-resistance state attaining pulse are repeated until a predetermined high-resistance state is reached. In writing of the data, by applying the high-resistance state attaining pulse while checking the resistance state after the data is deleted once, the application of the high-resistance state attaining pulse to the cell in the high-resistance state does not occur. As a result, the data is not written to a higher resistance level (increased resistance level), and thus there is no write failure in writing from the high-resistance state to the low-resistance state.

In a phase change random access memory apparatus, a minute current flows if a high-resistance state attaining pulse is applied in an amorphous high-resistance state. Due to gradual heating, crystallization occurs. As a result, the resistance value decreases and data breaks. In the phase change random access memory apparatus disclosed in patent document 3, to solve the problem associated with the write operation which would be caused by such an excess current, data to be written to an address is compared to data which has been read in advance from the address and a write pulse is applied when these data do not match.

Non-patent document 1: "High-Speed Resistive Switching of $TiO_2$/TiN Nano-Crystalline Thin Film" Japanese Journal of Applied Physics Vol. 45, No. 11, 2006, pp. L310-L312

Non-patent document 2: "Highly Scalable Non-volatile Resistive Memory using Simple Binary Oxide Driven by Asymmetric Unipolar Voltage Pulses" 0-7803-8684-1/04/ $20.00 (c)2004IEEE Patent document 1: U.S. Pat. No. 7,095,644 Specification Patent document 2: Japanese Laid-Open Patent Application Publication NO. 2004-185756

Patent document 3: Japanese Laid-Open Patent Application Publication No. 2005-108395

DISCLOSURE OF THE INVENTION

Problems to be Solved by the Invention

In the resistive random access memory apparatus disclosed in the patent document 1, the high-resistance state attaining pulse is applied to even the cell in the high-resistance state, whereas the low-resistance state attaining pulse is applied to even the cell in the low-resistance state. There is a possibility that since an unnecessary stimulus is imparted to the cell, the resistance state of the cell irreversibly changes.

In the nonvolatile memory apparatus disclosed in the non-patent document 2, if the low-resistance state attaining voltage (>high-resistance state attaining voltage) is applied repetitively to the element in the low-resistance state, a current which is larger than the first positive current value flows in the element. For example, if there is a variation in the upper limit value of the set current compliance, an unintended large current may flow in the element in some cases. If the current is beyond the second positive current value, then the element transitions from the low-resistance state to the high-resistance state. That is, data break occurs due to an excess current.

In the nonvolatile memory apparatus disclosed in the patent document 2, since all the data are deleted simultaneously, and then writing is performed while checking the state of the element, as in a flash memory, a write speed is slower relative to a read speed. There exists a problem that in a system which requires high-speed write, a new buffer memory is needed, increasing a circuit area.

There exists a problem that in the phase change random access memory apparatus disclosed in the patent document 3, the data is read in advance, making the write speed slower.

As should be appreciated from the above, the conventional configuration has a problem that reliability of the memory operation is not always high and the write speed becomes slow if an attempt is made to improve the reliability. The present invention is directed to solving the problem, and an object of the present invention is to improve reliability of a memory operation without reducing the speed of the write operation, in a nonvolatile memory apparatus.

Means for Solving the Problem

The inventors intensively studied to improve the reliability of the memory operation in the nonvolatile memory apparatus, and as a result, found out the following.

FIG. 18 is a view showing responsiveness of the resistive random access memory element in the case where a high-resistance state attaining pulse is applied after a low-resistance state attaining pulse is applied continuously. The resistance variable material is an iron oxide. A negative pulse (voltage: −4.5V, pulse width: 100 ns) is applied to change the resistive random access memory element to a low-resistance state LR ("1" data), while a positive pulse (voltage: 5.0V, pulse width: 100 ns) is applied to change the resistive random access memory element to a high-resistance state HR ("0" data). At this time, if a pulse of the same polarity (negative pulse in FIG. 18) is applied continuously, then the resistance state changes to an increased level (in this case, to an increased resistance state). It was found out that if an attempt is made to subsequently change the element to the other resistance state (e.g., from LR to HR) under such a situation, the resistance value cannot be changed to a desired value merely by applying one pulse (e.g., one positive pulse). It was also found out that such a phenomenon tends to be problematic in the phase change random access memory element or the resistive random access memory (ReRAM) element among the nonvolatile memory elements.

FIG. 19 is a view for explaining a write failure which accidentally occurs during data writing in the resistive random access memory element using the iron oxide as the resistance variable material. In the example of FIG. 19, a negative pulse (voltage: −4.5V, pulse width: 100 ns) is applied to change the memory cell to a low-resistance state, while a positive pulse (voltage: 5.0V, pulse width: 100 ns) is applied to change the memory cell to a high-resistance state. As shown in FIG. 19, normally, the resistance state changes every time an electric pulse is applied. However, with fifth pulse application, the resistance state does not change even though the negative pulse is applied, and thus a write failure occurs. It was found out that such a phenomenon tends to become problematic especially in the resistive random access memory element among the nonvolatile memory elements.

To solve the above described problem, a nonvolatile memory apparatus of the present invention comprises a plurality of memory cell arrays each including a plurality of nonvolatile memory elements having a characteristic in which a resistance value thereof changes according to electric pulses applied; and a control section which is configured to, in writing of data for the plurality of memory cell arrays, write data to a memory cell array and read data from another memory cell array such that writing of the data and reading of the data occur concurrently; wherein the control section includes: an address latch for temporarily holding address data input externally; a read data latch for temporarily holding read data which has been read from a nonvolatile memory element corresponding to the address data input externally; a write data latch for temporarily holding write data input externally; a comparator/determiner portion for comparing the write data held in the write data latch to the read data held in the read data latch; a write portion for inputting an electric pulse to the memory cell array, based on a determination result output from the comparator/determiner portion; a write switch for connecting the write portion to a specified memory cell array; a read switch for connecting the read data latch to a specified memory cell array; and an interleaving write control circuit which is configured to control the write switch to connect the write portion to a specified memory cell array at a specified timing and control the read switch to connect the read data latch to a specified memory cell array at a specified timing.

In such a configuration, since data is written to a memory cell array and data stored in another memory cell array is read such that writing of the data and reading of the data occur concurrently, apparent read time can be reduced. Therefore, the nonvolatile memory apparatus can improve reliability of the memory operation without reducing the speed of the write operation.

In such a configuration, also, the address data, the write data, and the read data are temporarily held, the read data which has been read in advance is compared to the write data input externally, based on the held data, and the electric pulse is applied based on a comparison result. The data can be read in advance concurrently with writing of data to another nonvolatile memory element. It is possible to diminish the application of the unnecessary electric pulse without reducing the speed of the write operation. As a result, reliability of the memory operation can be improved.

In the nonvolatile memory apparatus, the nonvolatile memory element may be a resistive random access memory element.

In such a configuration, it is possible to suppress reduction of responsiveness (phenomenon in which the resistance state does not easily change when the same electric pulses are applied and then a different electric pulse is applied) or a write failure (phenomenon in which the resistance state does not change even though a predetermined electric pulse is applied), which tend to be problematic especially in the nonvolatile memory element.

In the nonvolatile memory apparatus, the nonvolatile memory element may be a phase change random access memory element.

In such a configuration, it is possible to suppress reduction of responsiveness which is problematic in the phase change random access memory element.

In the nonvolatile memory element, the interleaving write control circuit may be configured to, prior to writing of data to a nonvolatile memory element corresponding to an address in writing of data to consecutive addresses, hold address data input externally in the address latch, hold write data input externally in the write data latch, control the read switch to connect the read data latch to a memory cell array including the nonvolatile memory element corresponding to the address data, read data stored in the nonvolatile memory element and hold the read data in the read data latch, then cause the comparator/determiner portion to compare the data stored in the read data latch to the data stored in the write data latch, control the write switch to connect the write portion to the memory cell array to cause the data stored in the write data latch to be written to the nonvolatile memory element and cause the write portion to output an electric pulse only when the data stored in the read data latch and the data stored in the write data latch do not match.

In such a configuration, the data stored in the nonvolatile memory element which is a write target is read in advance prior to writing of the data, and the electric pulse is applied based on a result of comparison between the read data and the write data. The data can be read in advance concurrently with writing of data to another nonvolatile memory element. The application of an unnecessary electric pulse is diminished without reducing the speed of the write operation, and as a result, reliability of the memory operation can be improved.

In the nonvolatile memory apparatus, the memory cell arrays may be two in number. The addresses may be respectively assigned to the memory cell arrays such that nonvolatile memory elements corresponding to two consecutive addresses are included in different memory cell arrays. The interleaving write control circuit may be configured to, in each period other than a first period, among periods which are set as time units during which writing or reading of data is performed for each address, in writing of the data to the consecutive addresses, hold in the address latch, address data input externally in the each period, hold in the write data latch, write data input externally in the each period, control the read switch to connect the read data latch to a memory cell array including a nonvolatile memory element corresponding to the address data input externally in the each period, read data stored in the nonvolatile memory element corresponding to the address data input externally in the each period and hold the data as the read data in the read data latch. The interleaving write control circuit may be configured to, control the write switch to connect the write portion to a memory cell array including a nonvolatile memory element corresponding to address data input externally in an immediately preceding period, cause the read data latch to output read data which has been read from the nonvolatile memory element corresponding to the address data input externally in the immediately preceding period to the comparator/determiner portion and the write data latch to output write data which has been input externally in the immediately preceding period to the comparator/determiner portion, and cause the write portion to output the electric pulse to write the write data input in the immediately preceding period to the nonvolatile memory element corresponding to the address data input externally in the immediately preceding period, only when the write data and the read data do not match, based on a determination result output from the comparator/determiner portion.

In such a configuration, in the case where the memory cell arrays are two in number, in the same period, data is read in advance from one of the memory cell arrays and data is written to the other based on a result of reading in advance. The application of the unnecessary electric pulse is diminished without reducing the speed of the write operation, and as a result, reliability of the memory operation can be improved.

In the nonvolatile memory apparatus, the memory cell arrays may be four or more in number. The addresses may be respectively assigned to the memory cell arrays such that nonvolatile memory elements corresponding to four consecutive addresses are included in different memory cell arrays. The write portion may include a first write circuit and a second write circuit. The interleaving write control circuit may be configured to, in each period other than first three periods, among periods which are set as time units during which writing or reading of data is performed for each address, in writing of the data to the consecutive addresses, hold in the address latch, address data input externally in the each period, hold in the write data latch, write data input externally in the each period, control the read switch to connect the read data latch to a memory cell array including a nonvolatile memory element corresponding to the address data input externally in the each period, read data stored in a nonvolatile memory element corresponding to the address data input externally in the each period and hold the data as the read data in the read data latch. The interleaving write control circuit may be configured to, control the write switch to connect the first write circuit to a memory cell array including a nonvolatile memory element corresponding to address data input externally in an immediately preceding period, cause the read data latch to output read data which has been read in the immediately preceding period from the nonvolatile memory element corresponding to the address data input externally in the immediately preceding period to the comparator/determiner portion and the write data latch to output write data which has been input externally in the immediately preceding period to the comparator/determiner portion, and cause the first write circuit to output the electric pulse to write the write data input in the immediately preceding period to the nonvolatile memory element corresponding to the address data input externally in the immediately preceding period, only when the read data and the write data do not match, based on a determination result output from the comparator/determiner portion. The interleaving write control circuit may be configured to, control the read switch to connect the read data latch to a memory cell array including a nonvolatile memory element corresponding to address data input externally in a preceding period which is two periods before the each period, read the data stored in the nonvolatile memory element corresponding to the address data input externally in the preceding period which is two periods before the each period and hold the data as the read data in the read data latch. The interleaving write control circuit may be configured to, control the write switch to connect the second write circuit to a memory cell array including a nonvolatile memory element corresponding to address data input externally in a preceding period which is three periods before the each period, cause the read data latch to output to the comparator/determiner portion read data which has been read in the immediately preceding period from the nonvolatile memory element corresponding to the address data input externally in the preceding period which is three periods before the each period and the write data latch to output to the comparator/determiner portion write data which has been input externally in the preceding period which is three periods before the each period, and cause the second write circuit to output the electric pulse to write the write data input in the preceding period which is three periods before the each period, to the nonvolatile memory element corresponding to the address data input externally in the preceding period which is three periods before the each period, only when the read data and the write data do not match, based on a determination result output from the comparator/determiner portion.

In such a configuration, in the case where the memory cell arrays are four in number, in the same period, data is read in advance from a first memory cell array, data is written to a second memory cell array based on a result of reading in advance, data is read for verification from a third memory cell array, and data is written to a fourth memory cell array based on a result of reading for verification. Therefore, the application of the unnecessary electric pulse is diminished. In addition, whether or not the nonvolatile memory element which is a write target has changed to a desired resistance state after the first writing is verified, and the electric pulse is applied again as required based on a result of verification. Therefore, it is possible to improve reliability of the memory operation without reducing the speed of the write operation.

In the nonvolatile memory apparatus, the nonvolatile memory element may be configured to change a resistance value thereof according to an accumulated application amount of an energy having a predetermined form. The write portion may be configured to apply the energy having the predetermined form to change the resistance value of the nonvolatile memory element.

In such a configuration, it is possible to control the resistance state of the nonvolatile memory element based on the accumulated application amount of energy.

In the nonvolatile memory apparatus, the accumulated application amount of the energy having the predetermined form may be an accumulated application amount of the electric pulse; and the write portion may be configured to apply the electric pulse to the nonvolatile memory element to change the resistance value of the nonvolatile memory element.

In such a configuration, the resistance state of the nonvolatile memory element can be controlled based on the accumulated application amount of the electric pulse.

A method of writing data to a nonvolatile memory apparatus including a plurality of memory cell arrays each including a plurality of nonvolatile memory elements having a characteristic in which a resistance value thereof changes according to electric pulses applied; and a control section which is configured to, in writing of data for the plurality of memory cell arrays, write data to a memory cell array and read data from another memory cell array such that writing of the data and reading of the data occur concurrently; wherein the control section includes: an address latch for temporarily holding address data input externally; a read data latch for temporarily holding read data which has been read from a nonvolatile memory element corresponding to the address data input externally; a write data latch for temporarily holding write data input externally; a comparator/determiner portion for comparing the write data held in the write data latch to the read data held in the read data latch; a write portion for inputting an electric pulse to the memory cell array, based on a determination result output from the comparator/determiner portion; a write switch for connecting the write portion to a specified memory cell array; a read switch for connecting the read data latch to a specified memory cell array; and an interleaving write control circuit which is configured to control the write switch to connect the write portion to a specified memory cell array at a specified timing and control the read switch to connect the read data latch to a specified memory cell array at a specified timing; the method comprising: using the interleaving write control circuit; prior to writing data to a nonvolatile memory element corresponding to an address in writing of the data to consecutive addresses; holding in the address latch address data input externally; holding in the write data latch write data input externally; controlling the read switch to connect the read data latch to a memory cell array including a nonvolatile memory element corresponding to the address data; reading data stored in the nonvolatile memory element and holding the data in the read data latch; then causing the comparator/determiner portion to compare the data stored in the read data latch to the data stored in the write data latch; only when the read data and the write data do not match, controlling the write switch to connect the write portion to the memory cell array to write the data stored in the write data latch to the nonvolatile memory element; and causing the write portion to output the electric pulse.

In such a configuration, since data is written to a memory cell array and data stored in another memory cell array is read such that writing of the data and reading of the data occur concurrently, apparent read time can be reduced. Therefore, the nonvolatile memory apparatus can improve reliability of the memory operation without reducing the speed of the write operation.

In the method of writing data to the nonvolatile memory apparatus, the addresses are respectively assigned to the memory cell arrays such that nonvolatile memory elements corresponding to two consecutive addresses are included in different memory cell arrays, and the method may further comprise in each period other than a first period, among periods which are set as time units during which writing or reading of data is performed for each address, in writing of the data to the consecutive addresses, holding address data input externally in the each period and holding write data input externally in the each period; reading data stored in a nonvolatile memory element corresponding to the address data input externally in the each period and holding the data as read data; comparing write data which has been input externally and held in an immediately preceding period to read data which has been read and held in the immediately preceding period; and applying the electric pulse to write the write data which has been input externally and held in the immediately preceding period to a nonvolatile memory element corresponding to the address data which has been input externally and held in the immediately preceding period, only when the read data and the write data do not match.

In such a configuration, in the case where the memory cell arrays are two in number, in the same period, data is read in advance from one of the memory cell arrays and data is written to the other based on a result of reading in advance. The application of the unnecessary electric pulse is diminished without reducing the speed of the write operation, and as a result, reliability of the memory operation can be improved.

In the method of writing data to the nonvolatile memory, the memory cell arrays may be four or more in number and the addresses are respectively assigned to the memory cell arrays such that nonvolatile memory elements corresponding to four consecutive addresses are included in different memory cell arrays; and the method may further comprise in each period other than first three periods, among periods which are set as time units during which writing or reading of data is performed for each address, in writing of the data to the consecutive addresses, holding address data input externally in the each period and holding write data input externally in the each period; reading data stored in a nonvolatile memory element corresponding to the address data input externally in the each period and holding the data as read data; comparing write data which has been input externally and held in an immediately preceding period to read data which has been read and held in the immediately preceding period; applying the electric pulse to write the write data which has been input externally and held in the immediately preceding period to a nonvolatile memory element corresponding to address data which has been input externally and held in the immediately preceding period, only when the read data and the write data do not match; reading data stored in a nonvolatile memory element corresponding to address data input externally in a preceding period which is two periods before the each period and holding the data as read data; comparing write data which has been input externally and held in a preceding period which is three periods before the each period to read data which has been read and held in the immediately preceding period from a nonvolatile memory element corresponding to address data input externally in the preceding period which is three periods before the each period; and applying the electric pulse to write the write data which has been input externally and held in the preceding period which is three periods before the each period to the nonvolatile memory element corresponding to the address data which has been input externally and held in the preceding period which is three periods before the each period, only when the read data and the write data do not match.

In such a configuration, in the case where the memory cell arrays are four in number, in the same period, data is read in advance from a first memory cell array, data is written to a second memory cell array based on a result of reading in advance, data is read for verification from a third memory cell array, and data is written to a fourth memory cell array based on a result of reading for verification. Therefore, the application of the unnecessary electric pulse is diminished. In addition, whether or not the nonvolatile memory element which is a write target has changed to a desired resistance state after the first writing is verified, and the electric pulse is applied again as required based on a result of verification. Therefore, it is possible to improve reliability of the memory operation without reducing the speed of the write operation.

In the method of writing data to the nonvolatile memory apparatus, the nonvolatile memory apparatus including a plurality of memory cell arrays each including nonvolatile memory elements whose resistance values change according to electric pulses applied, in which data is written to a memory cell array and data is read from another memory cell array such that writing of the data and reading of the data occur concurrently in writing of the data to the plurality of memory cell arrays, and the method may comprise in writing of the data to each of the memory cell arrays, holding address data input externally in a first period and holding write data input externally in the first period; reading data stored in a nonvolatile memory element corresponding to the address data input externally in the first period and holding the data as read data; comparing the write data to the read data; in a second period which is subsequent to the first period, applying the electric pulse to write the write data to a nonvolatile memory element corresponding to the address data which has been input externally and held in the first period which is an immediately preceding period of the second period; in a third period which is subsequent to the second period, reading data from the nonvolatile memory element which has been applied with the electric pulse and holding the data as read data; comparing the write data to the read data; in a second period which is subsequent to the first period, applying the electric pulse to write the write data to a nonvolatile memory element corresponding to the address data which has been input externally and held in the first period which is an immediately preceding period of the second period; in a third period which is subsequent to the second period, reading data from the nonvolatile memory element which has been applied with the electric pulse and holding the data as read data; comparing the write data to the read data; applying the electric pulse to write the write data to the nonvolatile memory element in a fourth period which is subsequent to the third period only when the write data and the read data do not match; and repeating a read and determination operation and a write operation until the read data of the nonvolatile memory element which has been applied with the electric pulse and the write data match.

The above and further objects, features and advantages of the present invention will more fully be apparent from the following detailed description of preferred embodiments with accompanying drawings.

Effects of the Invention

The present invention has the above described configuration, and has an advantage that reliability of a memory operation can be improved without reducing the speed of the write operation.

BRIEF DESCRIPTION OF THE DRAWINGS

FIG. 8 is a table showing an example of signals and others in each period in Embodiment 1 of the present invention.

FIG. 14 is a table showing an example of signals and others in each period in Embodiment 2 of the present invention.

Figure 1:
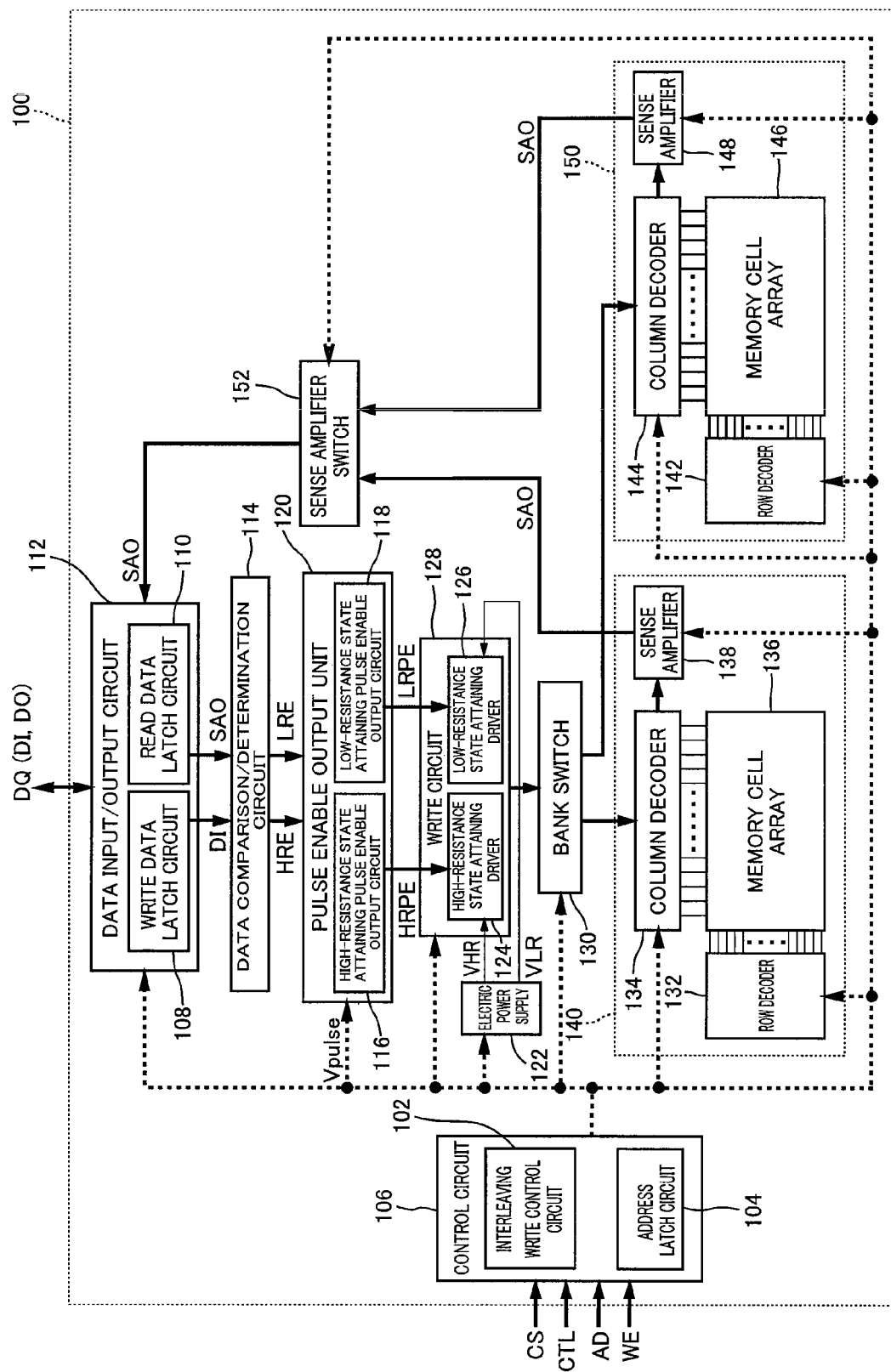
FIG. 1 is a block diagram showing an example of a schematic configuration of a nonvolatile memory apparatus according to Embodiment 1 of the present invention.

DESCRIPTION OF REFERENCE NUMERALS 1 control circuit
2 data input/output circuit
3 data comparison/determination circuit
4 write circuit
5 column decoder
6 row decoder
7 phase change random access memory cell array
8 sense amplifier
10 phase change random access memory apparatus
100 nonvolatile memory apparatus
102 interleaving write control circuit
104 address latch circuit
106 control circuit
108 write data latch circuit
110 read data latch circuit
112 data input/output circuit
114 data comparison/determination circuit
116 high-resistance state attaining pulse enable output circuit
118 low-resistance state attaining pulse enable output circuit
120 pulse enable output unit
122 electric power supply
124 high-resistance state attaining driver
126 low-resistance state attaining driver
128 write circuit
130 bank switch
132 row decoder
134 column decoder
136 memory cell array
138 sense amplifier
140 first bank
142 row decoder
144 column decoder
146 memory cell array
148 sense amplifier
150 second bank
152 sense amplifier switch
154 inverter
156 inverter
158 NAND circuit
160 NAND circuit
162 inverter
164 inverter
166 NAND circuit
168 NAND circuit
170 inverter
172 inverter
174 level shift circuit
176 level shift circuit
178 tri-state high-voltage buffer
180 tri-state high-voltage buffer
200 nonvolatile memory apparatus
202 interleaving write control circuit
204 address latch circuit
206 control circuit
208 write data latch circuit
210 read data latch circuit
212 data input/output circuit
214 first data comparison/determination circuit
215 second data comparison/determination circuit
216 high-resistance state attaining pulse enable output circuit
217 high-resistance state attaining pulse enable output circuit
218 low-resistance state attaining pulse enable output circuit
219 low-resistance state attaining pulse enable output circuit
220 first pulse enable output unit
221 second pulse enable output unit
224 high-resistance state attaining driver
225 high-resistance state attaining driver
226 low-resistance state attaining driver
227 low-resistance state attaining driver
228 first write circuit
229 second write circuit
230 bank switch
240 first bank
250 second bank
252 sense amplifier switch
260 third bank
270 fourth bank
WL1, WL2, . . . word line
SL1, SL2, . . . source line
BL1, BL2, . . . bit line
R11, R12, . . . nonvolatile memory element
T11, T12, . . . selection transistor
MC11, MC12, . . . memory cell

BEST MODE FOR CARRYING OUT THE INVENTION

Hereinafter, preferred embodiments of the present invention will be described with reference to the drawings.

Embodiment 1

Apparatus Configuration

FIG. 1 is a block diagram showing an example of a schematic configuration of a nonvolatile memory apparatus according to Embodiment 1 of the present invention. Hereinafter, with reference to FIG. 1, a nonvolatile memory apparatus 100 of this embodiment will be described.

The nonvolatile memory apparatus 100 comprises a control circuit 106 including an interleaving write control circuit 102 and an address latch circuit 104, a data input/output circuit 112 including a write data latch circuit 108 and a read data latch circuit 110, a data comparison/determination circuit 114 (comparator/determiner portion), a pulse enable output unit 120 (pulse enable output portion) including a high-resistance state attaining pulse enable output circuit 116 and a low-resistance state attaining pulse enable output circuit 118, an electric power supply 122, a write circuit 128 (write portion) including a high-resistance state attaining driver 124 and a low-resistance state attaining driver 126, a bank switch 130 (write switch), a first bank 140 (first memory cell array) including a row decoder 132, a column decoder 134, a memory cell array 136, and a sense amplifier 138, a second bank 150 (second memory cell array) including a row decoder 142, a column decoder 144, a memory cell array 146, and a sense amplifier 148, and a sense amplifier switch 152 (read switch).

A control section of the nonvolatile memory apparatus 100 includes the control circuit 106, the data input/output circuit 112, the data comparison/determination circuit 114, the pulse enable output unit 120, the write circuit 128, the bank switch 130, and the sense amplifier switch 152.

The control circuit 106 receives a chip select signal CS, a control signal CTL, an address signal AD, and a write enable signal WE from outside. The interleaving write control circuit 102 controls interleaving write. The detail of the interleaving write will be described layer. The address latch circuit 104 holds (temporarily holds) address data contained in an address signal. The address latch circuit 104 includes an address latch for the first bank (AL1) and an address latch for the second bank (AL2).

The data input/output circuit 112 receives write data (hereinafter expressed as DI) from outside and outputs read data (hereinafter expressed as DO) to outside via a data input/output terminal DQ. The write data latch circuit 108 holds (temporarily holds) the write data DI. The read data latch circuit 110 holds (temporarily holds) a sense amplifier output signal (hereinafter expressed as SAO) input to the data input/output circuit 112 from the sense amplifier 138 or 148 via the sense amplifier switch 152. The data input/output circuit 112 outputs DI and SAO to the data comparison/determination circuit 114. The write data latch circuit 108 includes a write data latch for the first bank (DL1) and a write data latch for the second bank (DL2). The read data latch circuit 110 includes a read data latch for the first bank (RL1) and a read data latch for the second bank (RL2).

The data comparison/determination circuit 114 receives DI and SAO from the data input/output circuit 117, compares a value of DI to a value of SAO, and selectively outputs a high-resistance state enable signal (hereinafter expressed as HRE) or a low-resistance state enable signal (hereinafter expressed as LRE) to the pulse enable output unit 120.

Figures 2, 3:
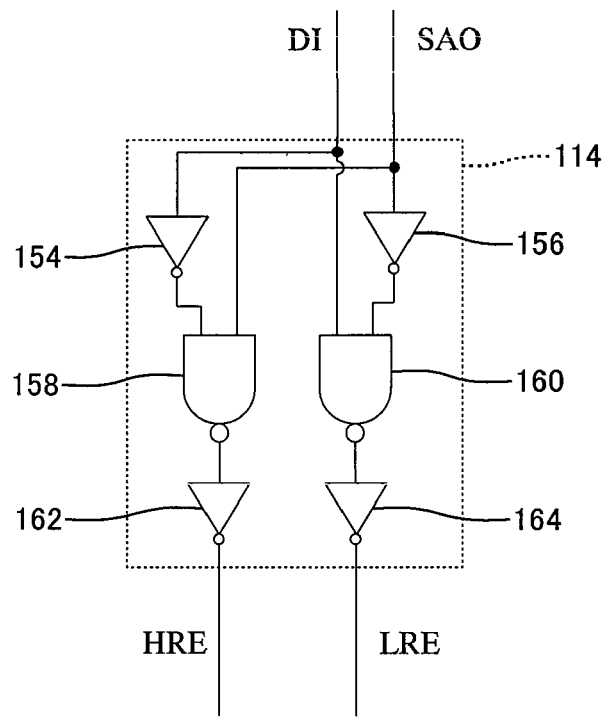
FIG. 2 is a circuit diagram showing an example of a configuration of a data comparison/determination circuit according to Embodiment 1.
FIG. 3 is a table showing the relationship among DI, SAO, HRE, and LRE.

FIG. 2 is a circuit diagram showing an example of a configuration of the data comparison/determination circuit in Embodiment 1. As shown in FIG. 2, the data comparison/determination circuit 114 includes inverters 154, 156, 162, and 164 and NAND circuits 158 and 160. DI is directly input to the NAND circuit 160 and to the NAND circuit 158 via the inverter 154. SAO is directly input to the NAND circuit 158 and to the NAND circuit 160 via the inverter 156. The NAND circuit 158 outputs HRE via the inverter circuit 162. The NAND circuit 160 outputs LRE via the inverter circuit 164. In such a configuration, according to the value of DI and the value of SAO, the value of HRE and the value of LRE are controlled.

FIG. 3 is a table showing the relationship among DI, SAO, HRE, and LRE. As shown in FIG. 3, when DI is equal to SAO, HRE and LRE are both L. When SAO is H and DI is L, only HRE is H. When DI is H and SAO is L, only LRE is H.

H indicates a high voltage and L indicates a low voltage. In this embodiment, H indicates an electric power supply voltage (hereinafter expressed as VCC) and L indicates a ground voltage (hereinafter expressed as GND) (The same applies hereinafter.) Note that the voltage of H and the voltage of L may have other values. H of the signal corresponds to the data "1." L of the signal corresponds to data "0." The data "1" corresponds to a low-resistance state (LR) of the nonvolatile memory element (described later), while the data "0" corresponds to a high-resistance state (HR) of the nonvolatile memory element.

The pulse enable output unit 120 receives HRE or LRE from the data comparison/determination circuit 114, receives a timing pulse signal (hereinafter expressed as Vpulse) from the control circuit 106, and sets a high-resistance state attaining pulse enable signal (hereinafter expressed as HRPE) or a low-resistance state attaining pulse enable signal (hereinafter expressed as LRPE) to H only during a period in which Vpulse is H.

Figure 4:
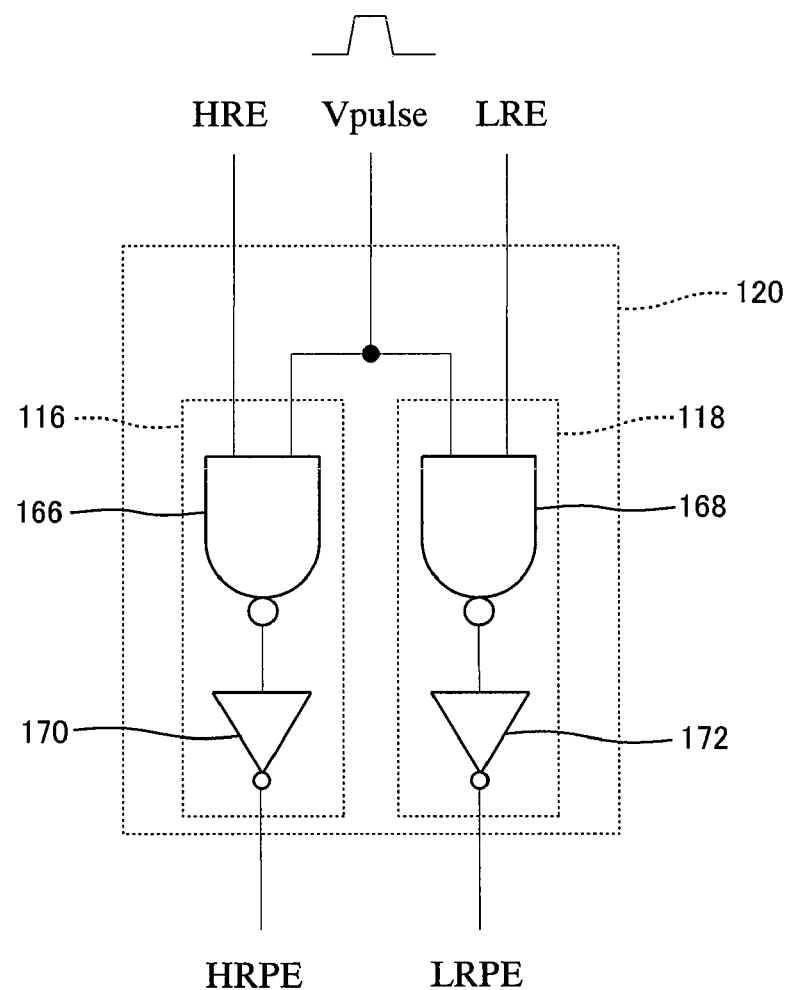
FIG. 4 is a circuit diagram showing an example of a configuration of a pulse enable output unit in Embodiment 1.

FIG. 4 is a circuit diagram showing an example of a configuration of the pulse enable output unit in Embodiment 1. As shown in FIG. 4, the pulse enable output unit 120 includes the high-resistance state attaining pulse enable output circuit 116 and the low-resistance state attaining pulse enable output circuit 118. The high-resistance state attaining pulse enable output circuit 116 includes a NAND circuit 166 and an inverter 170. The low-resistance state attaining pulse enable output circuit 118 includes a NAND circuit 168 and an inverter 172. HRE is input to the NAND circuit 166. LRE is input to the NAND circuit 168. In addition, Vpulse is input from the control circuit 106 to the NAND circuit 166 or 168. The NAND circuit 166 outputs HRPE via the inverter 170. The NAND circuit 168 outputs LRPE via the inverter 172. In such a configuration, when HRE is H, HRPE is also H (voltage: VCC) only during a period in which Vpulse is H. When LRE is H, LRPE is also H (voltage: VCC) only during a period in which Vpulse is H. In other periods, HRPE and LRPE are both L (voltage: GND).

The electric power supply 122 outputs either one of VHR and VLR to the write circuit 128.

The write circuit 128 receives HRPE or LRPE from the pulse enable output unit 120 and outputs an electric pulse at a specified timing using a voltage input from the electric power supply 122.

Figure 5:
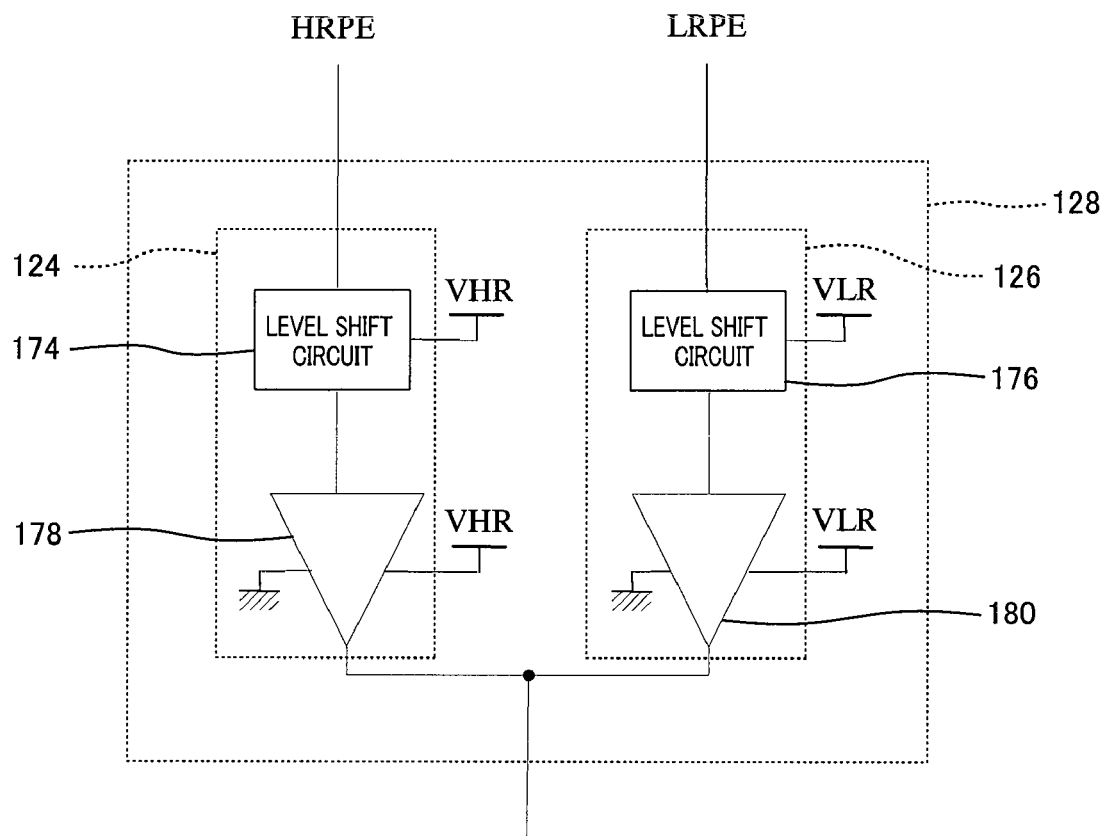
FIG. 5 is a circuit diagram showing an example of a configuration of a write circuit in Embodiment 1.

FIG. 5 is a circuit diagram showing an example of a configuration of the write circuit in Embodiment 1. As shown in FIG. 5, the write circuit 128 includes a high-resistance state attaining driver 124 and a low-resistance state attaining driver 126.

The high-resistance state attaining driver 124 includes a level shift circuit 174, and a tri-state high-voltage buffer 178. The level shift circuit 174 is connected to the high-resistance state attaining pulse enable output circuit 116 and to the voltage source of the VHR included in the electric power supply 122. When HRPE output from the high-resistance sate attaining pulse enable output circuit 116 is H (voltage: VCC), the level shift circuit 174 outputs VHR applied from the electric power supply 122. When HRPE is L (voltage: GND), the level shift circuit 174 outputs GND as it is. The tri-state high-voltage buffer 178 is connected to the output of the level shift circuit 174, to the voltage source of the VHR included in the electric power supply 122, and to the voltage source of GND. An enable signal (not shown) is input from the control circuit 106 to the tri-state high-voltage buffer 178. The tri-state high-voltage buffer 178 is in a high-impedance state when the enable signal is L, whereas the buffer 178 lowers its impedance (activated) when the enable signal is H, outputs a voltage (VHR or GND) input from the level shift circuit 174 and becomes a current source.

The low-resistance state attaining driver 126 includes a level shift circuit 176, and a tri-state high-voltage buffer 180. The level shift circuit 176 is connected to the low-resistance state attaining pulse enable output circuit 118 and to the voltage source of VLR included in the electric power supply 122. When LRPE output from the low-resistance sate attaining pulse enable output circuit 118 is H (voltage: VCC), the level shift circuit 176 outputs VLR applied from the electric power supply 122. When LRPE is L (voltage: GND), the level shift circuit 176 outputs GND as it is. The tri-state high-voltage buffer 180 is connected to the output of the level shift circuit 176, to the voltage source of VLR included in the electric power supply 122, and to the voltage source of GND. An enable signal (not shown) is input from the control circuit 106 to the tri-state high-voltage buffer 180. The tri-state high-voltage buffer 180 is in a high-impedance state when the enable signal is L, but it lowers its impedance (activated) when the enable signal is H, outputs a voltage (VLR or GND) input from the level shift circuit 176 and becomes a current source.

That is, when the pulse enable signal input from the control circuit 106 is L, the tri-state high-voltage buffer which should output an electric pulse is in the high impedance state (inactive state) and outputs GND, whereas when the pulse enable signal is H, the tri-state high-voltage buffer is in the low impedance state (active state) and outputs the electric pulse having a voltage of VLR or VHR. The tri-state high-voltage buffer which should not output an electric pulse is in the high-impedance state (inactive state) with the pulse enable signal input from the control circuit 106 maintained at L level.

The bank switch 130 connects the write circuit 128 to either one of the first bank 140 and the second bank 150 at a specified timing based on control of the control circuit 106.

The row decoders 132 and 142 are connected to the word lines of the memory cell array 136 and the word lines of the memory cell array 146, respectively. Each of the row decoders 132 and 142 selects a word line at a specified timing based on the control of the control circuit 106 and applies an activation voltage to the selected word line.

The column decoders 134 and 144 are connected to bit lines and source lines of the memory cell array 136 and to bit lines and source lines of the memory cell array 146, respectively. Each of the column decoders 134 and 144 selects one bit line or one source line based on the control of the control circuit 106. The selected bit line or source line is connected to the bank switch 130. The source lines and bit lines which have not been selected are electrically grounded. When the nonvolatile memory element is changed to the high-resistance state (write data: "0"), the bit line is selected, whereas when the nonvolatile memory element is changed to the low-resistance state (write data: "1"), the source line is selected. In this embodiment, the control circuit 106 controls the column decoder 134 or 144 with reference to data held in the write data latch circuit 108. Thereby, the selection of the bit line or the source line according to the write data is accomplished. Alternatively, the data held in the data latch circuit 108 may be directly sent to the column decoder 134 or 144. In this case, based on the received data, the column decoder 134 or 144 selects either one of the bit line and the source line.

Figure 6:
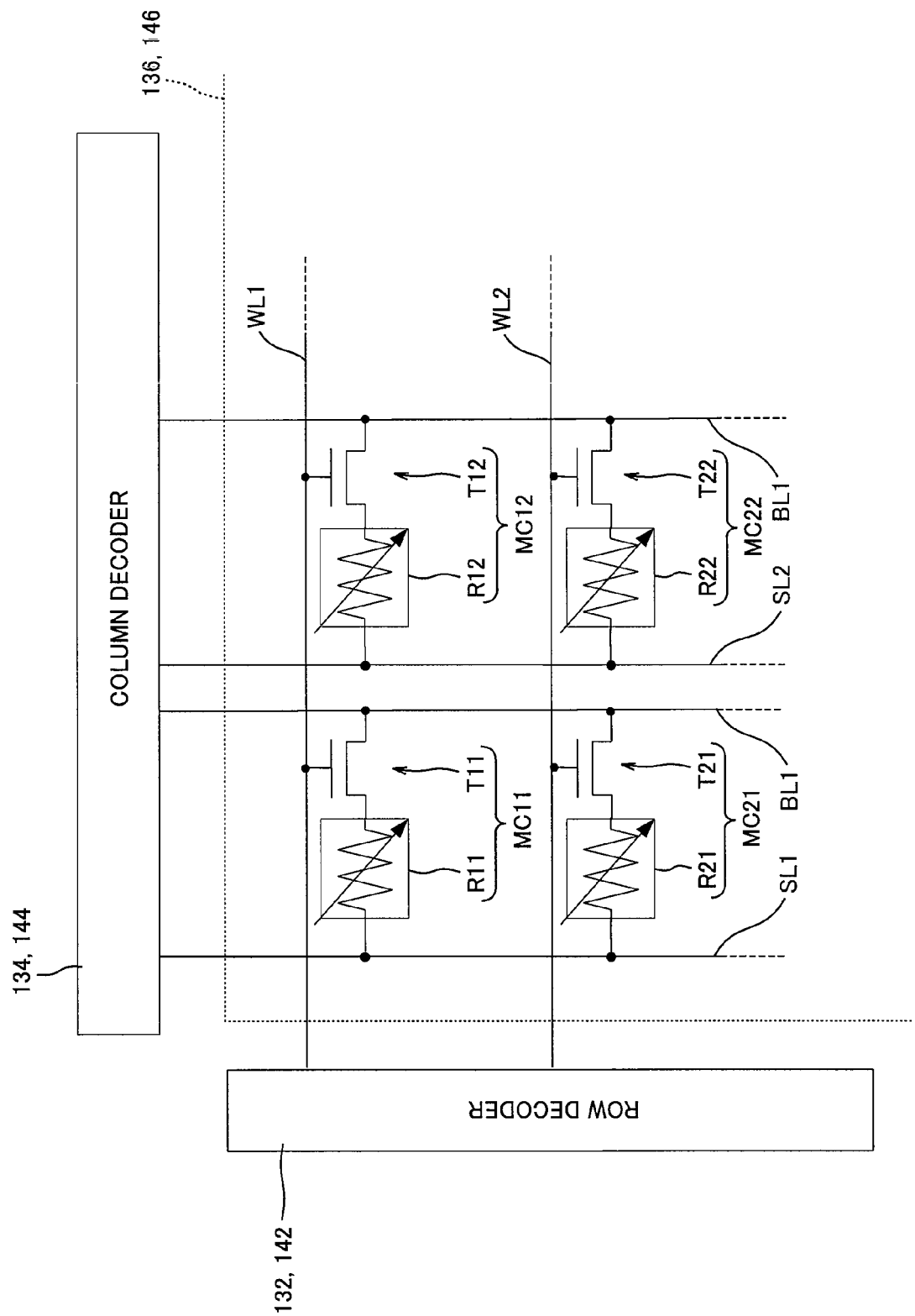
FIG. 6 is a wiring diagram showing an example of a memory cell array in Embodiment 1.

FIG. 6 is a wiring diagram showing an example of a configuration of the memory cell array in Embodiment 1. As shown in FIG. 6, the memory cell arrays 136 and 146 are each comprised of, on a substrate (not shown), a plurality of word lines WL1, WL2, . . . arranged to extend in parallel with each other within a first plane parallel to the substrate, a plurality of source lines SL1, SL2, . . . which are arranged to extend in parallel with each other within a second plane which is above and parallel to the first plane and to three-dimensionally cross the word lines WL1, WL2, . . . and a plurality of bit lines BL1, BL2, . . . which are arranged within a third plane which is above and parallel to the second plane such that the bit lines BL1, BL2, . . . extend in parallel with each other and in parallel with the source lines SL1, SL2, . . . and three-dimensionally cross the word lines WL1, WL2, . . . . Note that the vertical positional relationship between the word lines, the source lines, and the bit lines is not restricted.

Memory cells MC11, MC12, . . . including nonvolatile memory elements R11, R12, . . . and selection transistors T11, T12, . . . are arranged to respectively correspond to three-dimensional cross points of the plurality of word lines WL 1, WL2, . . . and the plurality of bit lines BL1, BL2, . . . .

In this embodiment, the nonvolatile memory elements R11, R12, . . . are resistive random access memory elements (ReRAM elements), but may be a phase change random access memory elements (PRAM elements). Hereinafter, the nonvolatile memory element connected to the word line selected by the row decoder 132 or 142 and to the bit line (or source line) selected by the column decoder 134 or 144 is referred to as a selected nonvolatile memory element. The resistive random access memory element changes its resistance state according to applied electric pulses having a specified voltage and a specified pulse width. The phase change random access memory element changes its resistance state according to applied electric pulses having a specified current and a specified pulse width. That is, these elements are identical in that they change their resistance states by application of electric pulses.

It is desired that the nonvolatile memory element change its resistance value according to the accumulated application amount of an energy having a specified form. In this case, the write circuit is configured to apply the energy having a specified form to change the resistance value of the nonvolatile memory element. The accumulated application amount of the energy having the specified form may be the accumulated application amount of the electric pulses applied. The resistive random access memory element may be of a bipolar-type or a non-polar (unipolar) type.

The nonvolatile memory elements R11, R12, . . . each has a structure in which a resistance variable material is sandwiched between an upper electrode and a lower electrode made of an electrode material such as Pt. As defined herein, the electrode at the substrate side is the lower electrode. In this embodiment, the upper electrode is connected to the source line and the lower electrode is connected to the bit line. The resistance variable material is desirably a tantalum oxide and satisfies $0<x<2.5$ when the tantalum oxide is expressed as TaOx. The tantalum oxide has extremely excellent characteristics (e.g., stability of operation, prolonged data retention characteristic, etc) as the resistance variable material. Note that other materials such as an iron oxide or $TiO_2/TiN$ may be used as the material for the resistance variable layer. Since a known configuration may be used for the configuration of the nonvolatile memory elements R11, R12, . . . , the detailed description will be omitted.

The nonvolatile memory elements R11, R12, . . . each changes to the high-resistance state (e.g., 2 kΩ) by applying GND to the upper electrode (source line) and by applying VHR (e.g., 2.7V) to the lower electrode (bit line) (thereby applying +2.7V to the nonvolatile memory element), while the nonvolatile memory elements R11, R12, . . . each changes to the low-resistance state (e.g., 200Ω) by applying GND to the lower electrode (bit line) and by applying VLR (e.g., 2.1V) to the upper electrode (source line) (thereby applying −2.1V to the nonvolatile memory element). As used hereinafter, the voltage of the lower electrode with respect to the upper electrode as a reference is the voltage applied to the nonvolatile memory element. The pulse width is suitably controlled. As used hereinafter, when a nonvolatile memory element included in a memory cell is in a high-resistance state, the memory cell is in the high-resistance state, while when a nonvolatile memory element included in a memory cell is in a low-resistance state, the memory cell is in the low-resistance state. The data is stored in the nonvolatile memory element (memory cell) by corresponding the data to the resistance state of the nonvolatile memory element (memory cell). "0" corresponds to the high-resistance state and "1" corresponds to the low-resistance state. By applying the electric pulse to the nonvolatile memory element (memory cell), the data is stored in the nonvolatile memory element (memory cell). As used hereinafter, the electric pulse applied to the nonvolatile memory element to change the nonvolatile memory element in the low-resistance state to the high-resistance state is referred to as a high-resistance state attaining pulse, while the electric pulse applied to the nonvolatile memory element to change the nonvolatile memory element in the high-resistance state to the low-resistance state is referred to as a low-resistance state attaining pulse. In this embodiment, the electric pulse whose voltage is VHR is the high-resistance state attaining pulse, while the electric pulse whose voltage is −VLR is the low-resistance state attaining pulse.

The sense amplifier 138 or 148 applies a voltage to a path extending from the bit line to the source line through each memory cell via the associated column decoder. During a read operation, the source lines are electrically grounded, and a current flows in the order of the sense amplifier, the column decoder, the bit line and the source line. The sense amplifier 138 or 148 senses the resistance state (high-resistance state/low-resistance state) of the selected nonvolatile memory element based on the current flowing in the associated bit line BL1, BL2, . . . , and outputs a result.

The sense amplifier switch 152 connects either one of the sense amplifiers 138 and 148 to the data input/output circuit 112 at a specified timing based on the control of the control circuit 106.

Having described an example of writing and reading performed bit by bit, they may be performed for each unit of plural bits. In a case where writing is performed for each unit of plural bits, the comparison/determination circuit 114, the pulse enable output unit 120, and the write circuit 128 are respectively designed to have configurations shown in FIGS. 2, 4, and 5 to correspond with the number of bits. In this case, a plurality of nonvolatile memory elements correspond to one address and write data of plural bits are input externally to one address.

Having described an example in which the electric pulse output from the driver of the write circuit is input to the selected bit line or source line via the bank switch 130 and the column decoder 134 or 144, the configuration is not limited to this. For example, in the case where polarities of VLR and VHR are made different, the column decoder may be configured to select one of the bit lines and the source lines may be always electrically grounded. In this case, the electric pulse (electric pulse having a positive or negative voltage) output from the write circuit 128 is applied to the lower electrode of the nonvolatile memory element via the selected bit line. The source lines need not be connected to the column decoder.

In the case where the voltage of the high-resistance state attaining pulse and the voltage of the low-resistance state attaining pulse have opposite polarities and an equal absolute value, the high-resistance state attaining driver and the low-resistance state attaining driver may be configured as a common driver. If the output voltage of the driver is plus (e.g., +5.0V), the positive electric pulse (+5.0V) is applied to the selected nonvolatile memory element by applying the output electric pulse to the bit line, and by applying GND to the source line. The negative electric pulse (−5.0V) is applied to the selected nonvolatile memory element by applying the output electric pulse to the source line, and by applying GND to the bit line.

In the case where the high-resistance state attaining pulse and the low-resistance state attaining pulse have the same polarity, VLR and VHR may be set to the same polarity and the column decoder may be configured to select one of the bit lines. In this case, the source lines may be configured to be always electrically grounded. The source lines need not be connected to the column decoder.

Operation

Figure 7:
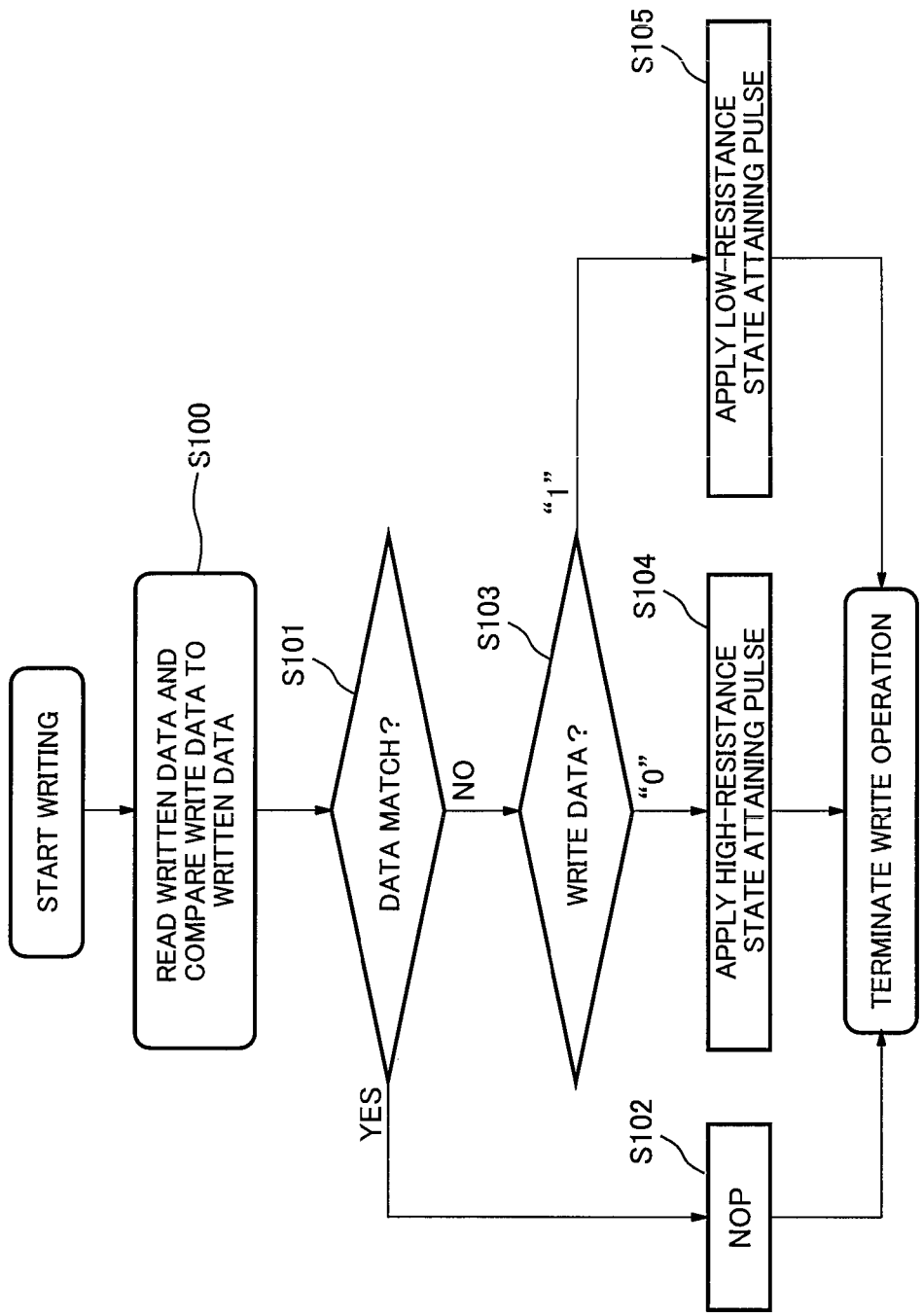
FIG. 7 is a flowchart showing an operation for writing data to a memory cell in a nonvolatile memory apparatus 100.

Hereinafter, the operation of the nonvolatile memory apparatus 100 will be described. FIG. 7 is a flowchart showing an operation for writing data to a memory cell in the nonvolatile memory apparatus 100. In actuality, the interleaving write is performed and writing of data to the plurality of memory cells occurs concurrently. However, for simple illustration of the drawing, the write operation only for a single memory cell is schematically shown.

When the write operation starts, data is read from the memory cell which is a write target and is compared to write data (step S100).

It is determined whether or not these data match (step S101). If it is determined that these data match, no electric pulse is applied (step S102), and the write operation terminates. The state where no electric pulse is applied is expressed as NOP (No operation).

If it is determined that these data do not match in step S101, then it is determined whether the write data is "1" or "0" (step S103). If it is determined that the write data is "0," the high-resistance state attaining pulse is applied (step S104), and the write operation terminates. If it is determined that the write data is "1," the low-resistance state attaining pulse is applied (step S105), and the write operation terminates.

As described above, in this embodiment, the write data is compared to the read data prior to applying the electric pulse, and the electric pulse is applied only when these data do not match. Such an operation is suitably adapted for the high-speed writing in which data is read in advance. There is a problem that since in the writing in which data is read in advance, some time is usually needed to read data in advance, and thereby a write speed is reduced as a whole.

In the interleaving write of this embodiment, data is written to a memory cell array, and data is read from another memory cell array such that writing of the data and reading of the data occur concurrently. That is, while data is read from a memory cell array in advance, data is written to another memory cell array. Such a control makes it possible to hide a latency required to read data in advance. As a result, the write speed is improved as a whole while reading the data in advance.

Subsequently, the detail of the write operation under the interleaving control in this embodiment will be described. FIG. 8 is a table showing an example of signals and others in each period in Embodiment 1 of the present invention. As used herein, the term "period" refers to a period corresponding to each internal clock (internal pulse) generated in the control circuit 106. The period is defined to correspond to the internal clock generated in the control circuit. It is supposed that all the periods have an equal time width and only one of writing and reading is performed for the same memory cell within the same period. As shown in FIG. 8, for each period, the values of DI, AD, and SAO input externally, the values stored in the write data latch circuit 108 (write data latch for the first bank (DL1) and write data latch for the second bank (DL2)) in the data input/output circuit 112 and the values stored in the read data latch circuit 110 (read data latch for the first bank (RL1) and read data latch for the second bank (RL2)) in the data input/output circuit 112, the values stored in the address latch circuit 104 (address latch for the first bank (AL1), address latch for the second bank (AL2) in the control circuit 106, addresses in the first bank 140 for which the write operation and the read operation are performed, and addresses in the second bank 150 for which the write operation and the read operation are performed. In the table, the arrow "→" depicted at the left of a variable name means that the operation for storing the data in the associated latch is performed in the associated period. Also, the arrow "→" depicted at the right of a variable name means that the data is output from the associated latch in the associated period. Also, no arrow means that the associated latch holds the data in the associated period (the same applies to Embodiment 2).

In this embodiment, the address having address data whose least significant bit is "0" is assigned to the first bank 140, while the address having address data whose least significant bit is "1" is assigned to the second bank 150. That is, the addresses are assigned to the nonvolatile memory elements in the memory cell arrays so that nonvolatile memory elements corresponding to two consecutive addresses are included in different memory cells arrays. Note that one nonvolatile memory element need not correspond to one address, but plural bits (e.g., one byte) may be assigned to a single address (the same applies to Embodiment 2). Hereinafter, it is supposed that the input addresses are consecutive. Each operation is performed based on the control of the control circuit 106 (interleaving write control circuit 102). Writing of data starts upon address data and write data being input when the chip select CS is H and the write enable WE is H.

In a first period, data is primarily read from a memory cell corresponding to an address input in this period. Suppose that in the first period, the value input as AD is A1 and the value input as DI is D1. Supposing that the least significant bit of A1 is "0," the bank corresponding to A1 is the first bank 140. A1 is stored in the address latch for the first bank (AL1) and D1 is stored in the write data latch for the first bank (DL1). The sense amplifier switch 152 is switched to connect the first bank 140 to the data input/output circuit 112. To be specific, the read data latch for the first bank (RL1) is connected to the sense amplifier 138 in the first bank 140. In the first bank 140, the memory cell (memory cell in the first bank) corresponding to A1 is activated by the row decoder 132 and the column decoder 134. A read voltage is applied to the memory cell, enabling the resistance state to be read. When the value of the read SAO (read data from the first bank) is R1, R1 is stored in the read data latch for the first bank (RL1).

In a second period, primarily, data is read from a memory cell corresponding to an address input in this period and data is written to a memory cell corresponding to the address input in a preceding period (first period) which is one period before the second period. Suppose that the value input as AD in the second period is A2 and the value input as DI in the second period is D2. Since the addresses input are consecutive, the bank corresponding to A2 is the second bank 150. A2 is stored in the address latch for the second bank (AL2) and D2 is stored in the write data latch for the second bank (DL2). The sense amplifier switch 152 is switched to connect the second bank 150 to the data input/output circuit 112. To be specific, the read data latch for the second bank (RL2) is connected to the sense amplifier 148 in the second bank 150. The bank switch 130 is switched to connect the write circuit 128 to the first bank 140. When the bank is connected to the write circuit, the column decoder included in the bank is connected to the output line of the write circuit (the same occurs hereinafter). The resistance state of a memory cell (memory cell in the second bank) whose address is A2 is read. When the value of SAO read (read data from the second bank) is R2, R2 is stored in the read data latch for the second bank (RL2). D1 stored in the write data latch DL1 (DL1) and R1 stored in the read data latch RL1 (RL1) are input to the data comparison/determination circuit 114 (in the figures, D1 and D2 are expressed as D1 and R1 and R2 are expressed as SAO). The data comparison/determination circuit 114 adjusts HRE or LRE into a predetermined value and outputs it to the pulse enable output unit 120, based on a result of comparison between D1 and R1 (see FIG. 3). Based on the HRE or LRE received and Vpulse received from the control circuit 106, the pulse enable output unit 120 outputs to the write circuit 128 HRPE or LRPE at H level at a specified timing. The write circuit 128 outputs an electric pulse whose voltage is VHR when HRPE is H, while it outputs an electric pulse whose voltage is VLR when LRPE is H. The electric pulse output from the write circuit 128 is input to the first bank 140 via the bank switch 130. D1 stored in the write data latch for the first bank (DL1) is also sent to the control circuit 106. The control circuit 106 controls the column decoder 134 based on D1 received. In the first bank 140, the memory cell corresponding to A1 stored in the address latch for the first bank (AL1) is activated by the row decoder 132 and the column decoder 134, and the electric pulse is applied to the nonvolatile memory element included in the memory cell to write the data. When D1 is "0" and R1 is "1," the column decoder 134 selects the bit line corresponding to the memory cell and the high-resistance state attaining pulse is applied to the memory cell (PULSE). When D1 is "1" and R1 is "0," the column decoder 134 selects the source line corresponding to the memory cell and the low-resistance state attaining pulse is applied to the memory cell (PULSE). When D1 is equal to R1, HRPE and LRPE remain L, and no electric pulse is output (NOP).

In a third period, primarily, data is read from a memory cell corresponding to an address input in this period and data is written to the memory cell corresponding to the address input in the preceding period (second period) which is one period before the third period. Suppose that the value input as AD in the third period is A3 and the value input as DI in the third period is D3. Since the addresses input are consecutive, the bank corresponding to A3 is the first bank 140. A3 is stored in the address latch for the first bank (AL1) and D3 is stored in the write data latch for the first bank (DL1). Accordingly, the value stored in the address latch for the first bank (AL1) and the value stored in the write data latch for the first bank (DL1) are updated. The sense amplifier switch 152 is switched to connect the first bank 140 to the data input/output circuit 112. To be specific, the read data latch for the first bank (RL1) is connected to the sense amplifier 138 in the first bank 140. The bank switch 130 is switched to connect the write circuit 128 to the second bank 150. The resistance state of a memory cell (memory cell in the first bank) whose address is A3 is read. When the value of SAO read (read data from the first bank) is R3, R3 is stored in the read data latch for the first bank (RL1). Accordingly, the value stored in the read data latch for the first bank (RL1) is updated. D2 stored in the write data latch for the second bank (DL2) and R2 stored in the read data latch for the second bank (RL2) are input to the data comparison/determination circuit 114. The pulse enable output unit 120 and the write circuit 128 operate in association with each other and the electric pulse is output to the second bank 150 if a predetermined condition is met (see FIG. 3). D2 stored in the write data latch for the second bank (DL2) is also sent to the control circuit 106. The control circuit 106 controls the column decoder 144 based on D2 received. In the second bank 150, the memory cell corresponding to A2 stored in the address latch for the second bank (AL2) is activated by the row decoder 142 and the column decoder 144, and the electric pulse is applied to the nonvolatile memory element included in the memory cell to write data thereto. When D2 is "0" and R2 is "1," the column decoder 144 selects the bit line corresponding to the memory cell and the high-resistance state attaining pulse is applied to the memory cell (PULSE). When D2 is "1" and R2 is "0," the column decoder 134 selects the source line corresponding to the memory cell and the low-resistance state attaining pulse is applied to the memory cell (PULSE). When D2 is equal to R2, HRPE and LRPE remain L, and no electric pulse is output (NOP).

The operation in a fourth period and the following periods is similar to the operation in the second period or the third period, and will not be further described (see FIG. 8).

Figure 9:
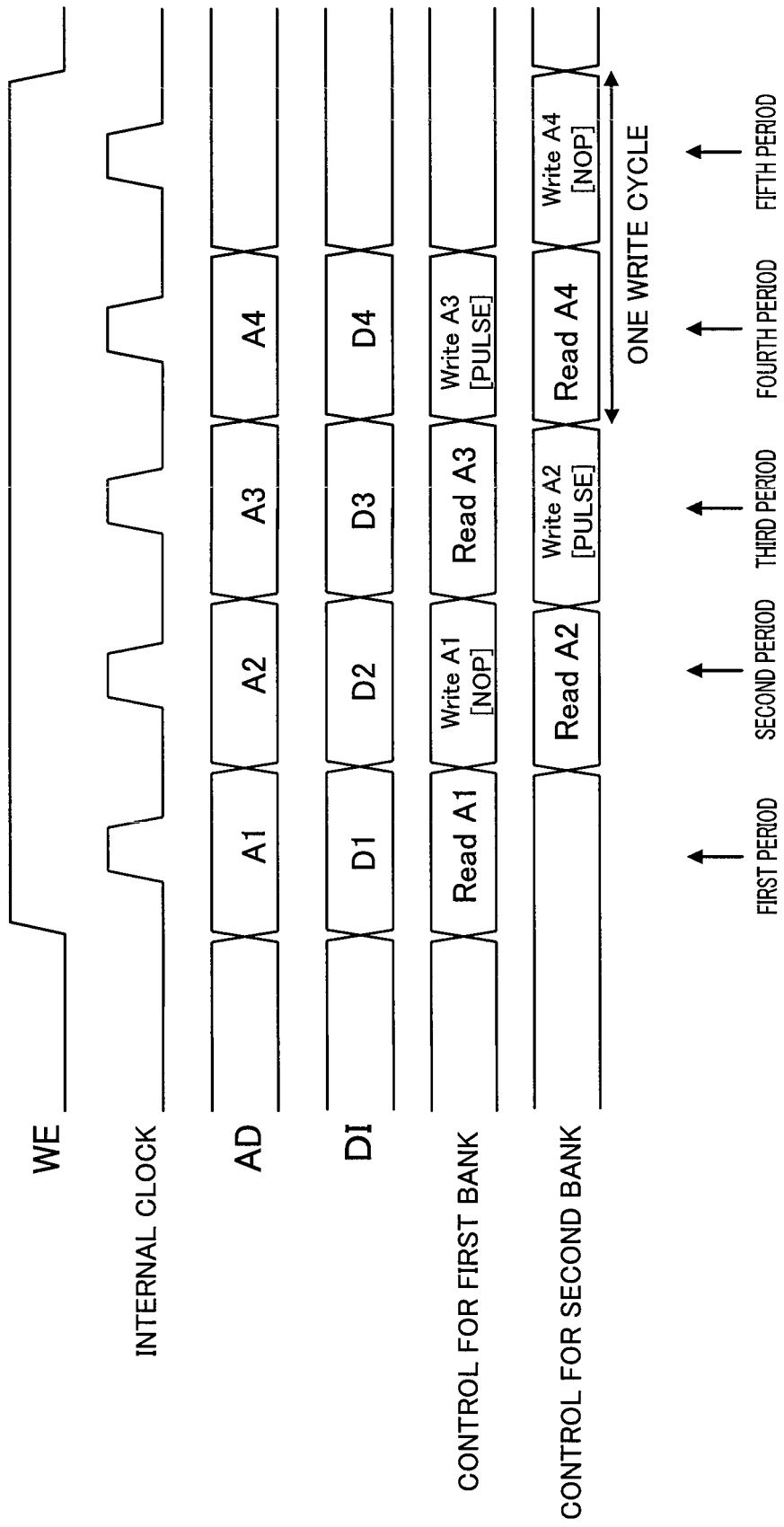
FIG. 9 is an example of a timing chart of interleaving write which is performed by the nonvolatile memory apparatus according to Embodiment 1 of the present invention.

FIG. 9 is an example of a timing chart of the interleaving write performed by the nonvolatile memory apparatus of Embodiment 1 of the present invention. In FIG. 9, NOP indicates that no electric pulse is applied to an associated address in an associated period, and PULSE indicates that an electric pulse is applied to an associated address in an associated period (the same applies to Embodiment 2)

As shown in FIG. 9, in the first period, A1 is input as address AD, D1 is input as write data, and data written to the memory cell in the first bank corresponding to A1 is read (Read A1).

In the second period, A2 is input as address AD, D2 is input as write data, data is written to the memory cell in the first bank corresponding to A1 (Write A1), and data written to a memory cell in the second bank corresponding to A2 is read (Read A2). In the second period, a write cycle (one read and one write) for the memory cell corresponding to A1 is complete.

In the third period and the following periods, writing and reading takes place alternately for each bank in the manner described above. The aforesaid operation is referred to as the interleaving write. As shown in FIG. 9, in an actual write operation, when the read data and the write data do not match, the electric pulse is applied (PULSE), while when the read data and the write data match, no electric pulse is applied (NOP).

A known method is applicable as a method of reading data (data output to outside), and therefore will not be described herein.

Effect

Figure 18:
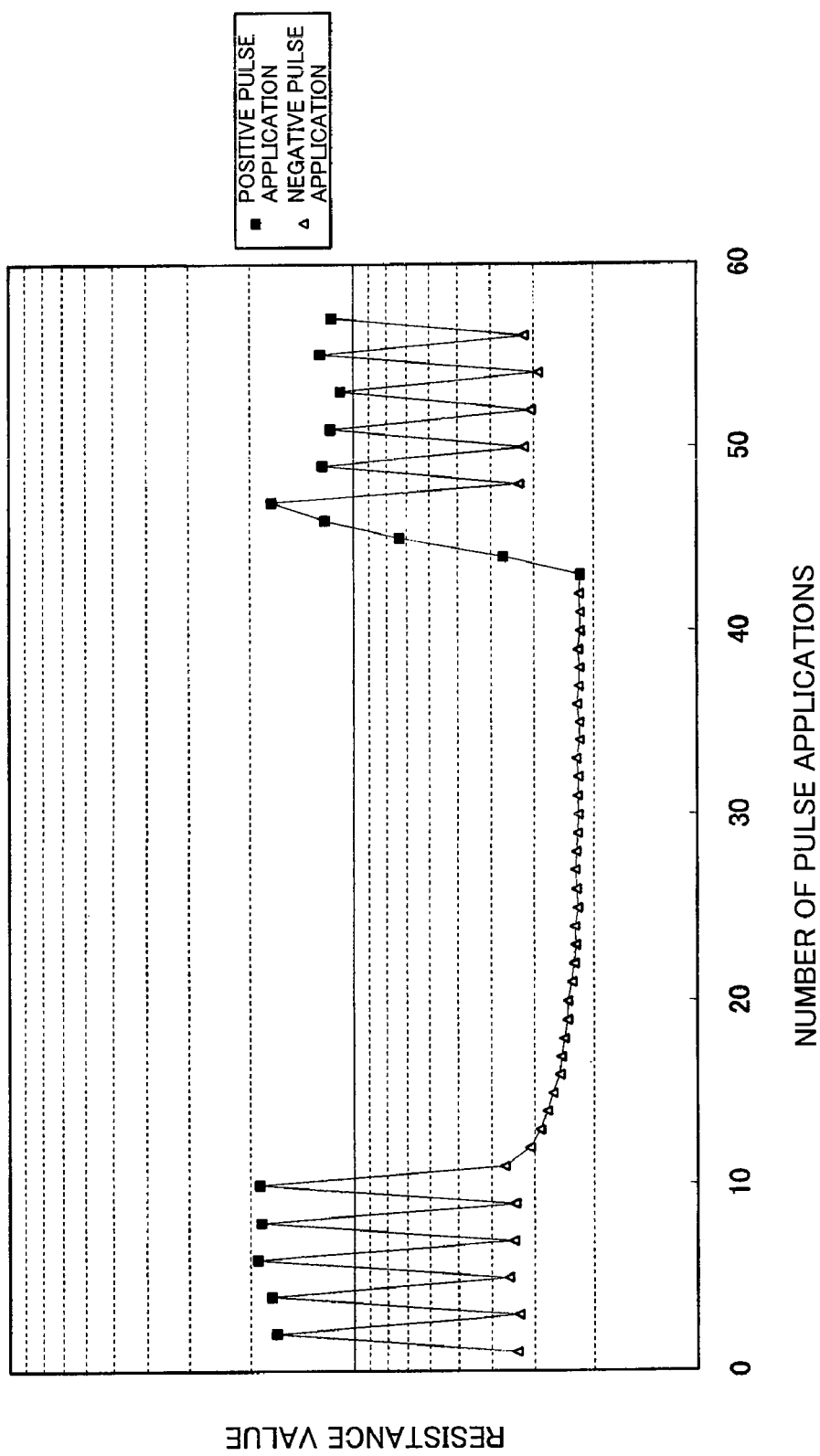
FIG. 18 is a view showing responsiveness of the resistive random access memory element in a case where a high-resistance state attaining pulse is applied after low-resistance state attaining pulses are applied continuously.

As described above, in this embodiment, when data is written to consecutive addresses, writing and reading take place alternately for the first bank and the second bank concurrently in successive periods. To be specific, during the period when writing occurs for the first bank, reading occurs for the second bank, whereas during the period when reading occurs for the first bank, writing occurs for the second bank. In writing, the data read in an immediately preceding period is compared to the write data, and the electric pulse is applied to the memory cell when the read data and the write data do not match. No electric pulse is applied when the read data and the write data match. The high-resistance state attaining pulse is not applied to the memory cell in the high-resistance state and the low-resistance state attaining pulse is not applied to the memory cell in the low-resistance state. Such a control enables the writing in which the data is read in advance without reducing a write speed of data. As a result, reduction of responsiveness which would be caused by application of unnecessary electric pulses (see FIG. 18) is prevented, and thus reliability of a memory operation is improved.

The configuration of this embodiment is particularly effective when a write time per cell is short. In the case where the write time is short, a time required for reading is non-negligible relative to a time required for writing. By applying the configuration of this embodiment to such a case, reliability is improved by reading the data in advance and an operation speed is not reduced. That is, the configuration of this embodiment is particularly effective to the configuration using the nonvolatile memory element which has a high write speed, such as the resistive random access memory element and the phase change random access memory element.

Modification

The nonvolatile memory apparatus of this embodiment need not always be a binary memory but may be a multi-valued memory. Even in the multi-valued memory, application of the unnecessary electric pulses does not occur by reading data in advance. As a result, reliability of a memory operation is improved.

In the case where the phase change random access memory element is used as the nonvolatile memory element, the write circuit applies an electric pulse (pulse current for heating). In such a configuration, also, reduction of responsiveness due to undesired heating is prevented, and as a result, reliability of the memory operation is improved.

Comparative Example

Figure 10:
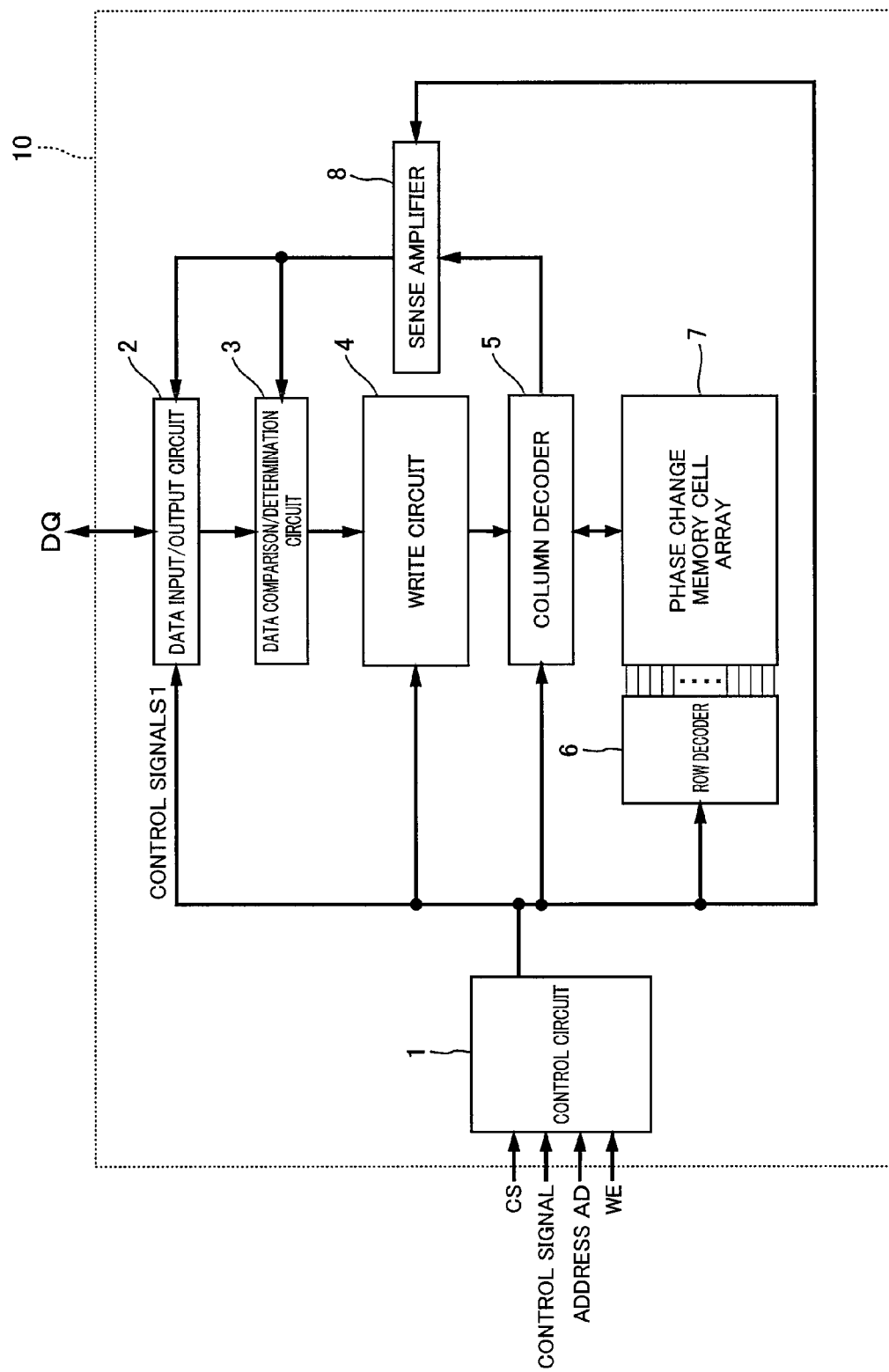
FIG. 10 is a block diagram showing a configuration of a phase change random access memory apparatus according to Comparative example.

FIG. 10 is a block diagram showing a configuration of a phase change random access memory apparatus according to Comparative example. As shown in FIG. 10, a phase change random access memory apparatus 10 of Comparative example comprises a control circuit 1, a data input/output circuit 2, a data comparison/determination circuit 3, a write circuit 4, a column decoder 5, a row decoder 6, a phase change random access memory cell array 7, and a sense amplifier 8. The phase change random access memory cell array 7 includes one transistor one resistance variable element (1T1R) cells which are arranged in an array form.

Figure 11:
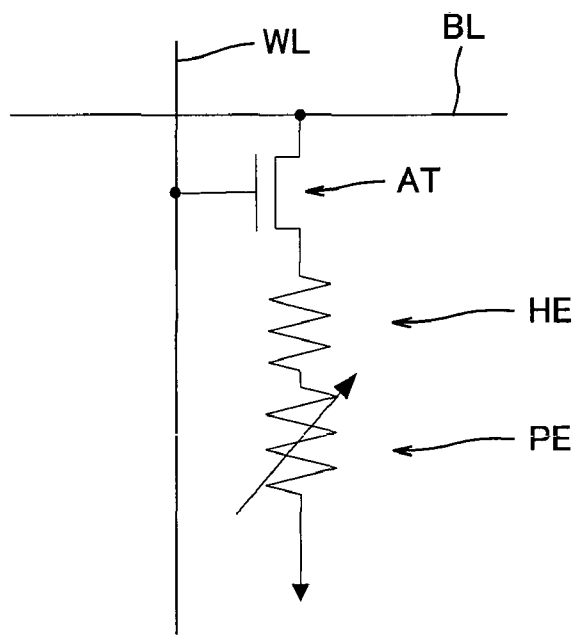
FIG. 11 is a circuit diagram showing a configuration of a 1T1R type phase change random access memory cell unit.

FIG. 11 is a circuit diagram showing a configuration of a 1T1R phase change random access memory cell unit. As shown in FIG. 11, in this modification, the memory cell includes a selection transistor AT which is provided to correspond to a cross point of the word line WL and the bit line BL and has a gate connected to the word line WL and one end connected to the bit line BL, a heater element HE and a phase change random access memory element PE such as chalcogenide glass (GeSbTe) which are connected in series between the other end of the selection transistor AT and a ground node. In the memory cell, data is stored to correspond to the resistance value of the phase change random access memory element PE. A low-resistance state in a crystallized state is allocated to the data "1," while a high-resistance state which is an amorphous state is allocated to data "0." The write circuit 4 includes a high-resistance state attaining current pulse application circuit and a low-resistance state attaining current pulse application circuit. In writing, the write circuit 4 applies a predetermined current pulse (high-resistance state attaining current pulse, low-resistance state attaining current pulse or 0V) to a specified cell via the column decoder 5 according to a control signal S1 output from the control circuit 1.

In writing, the data comparison/determination circuit 3 compares the data which has been already written to a write address and read by the sense amplifier 8 to data to be written to a specified address to determine whether or not these data match. The data comparison/determination circuit 3 controls the write circuit 4 to apply a predetermined write current pulse to the specified cell only when these data do not match.

The word line WL of the memory cell is selected by the row decoder 6. The control circuit 1 outputs a control signal S1 according to the chip select CS, the address AD, the control signal and the write enable WE which are input thereto, and controls circuit blocks such as the row decoder 6, the column decoder 5, the sense amplifier 8 and the write circuit 4 to perform read and write operations for a desired cell.

In data reading, bit line data selected by the column decoder 5 is sensed and amplified by the sense amplifier 8 and is taken out to the data input/output terminal DQ via the data input/output circuit 2. In the data writing, initially, the data already written to the write address is read via the sense amplifier 8, and the data comparison/determination circuit 3 compares the data which has been read to the data to be written to a specified address, which has been transferred via the data input/output circuit 2, to determine whether or not these data match. The data comparison/determination circuit 3 controls the write circuit 4 to apply a predetermined write current pulse to a specified cell via the column decoder 5 only when these data do not match. To be specific, the data input through the data input/output terminal DQ is latched in the data input/output circuit 2, and is transferred to the bit line BL selected by the column decoder 5 via the write circuit 4 controlled by the data comparison/determination circuit 3.

The operation of the phase change random access memory apparatus according to Comparative example configured in the manner described above will be described.

First, the data read operation will be described. As shown in FIGS. 10 and 11, for a desired cell which has been activated by the chip select CS and selected by the address AD, the word line WL is activated and the selection transistor AT is placed in an electrically-conductive state. At this time, a clamp voltage is applied to the bit line, a current flows in the memory cell, the current is sensed and amplified by the sense amplifier 8 connected by the column decoder 5, and the data is read from the memory cell via the data input/output circuit 2 through the data input/output terminal DQ.

Then, in the data write operation, initially, the data already written to the address AD is read via the sense amplifier 8, and the data comparison/determination circuit 3 compares the data which has been read to the data to be written to the address AD which has been transferred via the data input/output circuit 2, to determine whether or not these data match. The data comparison/determination circuit 3 controls the write circuit 4 to apply a predetermined write pulse to a specified cell via the column decoder 5 only when these data do not match, thereby writing data. That is, in the case where the write data is "0," no current pulse is applied (NOP: no operation) if the data already written to the write address AD is "0," while the high-resistance state attaining pulse is applied if the read data is "1." In the case where the write data is "1," no current pulse is applied (NOP: no operation) if the data already written to the write address AD is "1," while the low-resistance state attaining pulse is applied if the read data is "0."

To be specific, a selection voltage as a word line voltage is applied to the word line WL of the memory cell selected according to the chip select CS, the write address AD, and the data input through the data input/output terminal DQ, while 0V is applied to a non-selected word line WL. At this time, a high-resistance state attaining current pulse (0.75 mA, pulse width: 85 ns), a low-resistance state attaining current pulse (0.3 mA, pulse width: 85 ns), or 0V is applied to the bit line BL connected to the selected cell according to the write enable WE and the data to be written to the cell. In the cell which has been applied with the high-resistance state attaining pulse, the multi-crystal chalcogenide phase change element PE is heated by the heater element HE to a certain temperature or higher, and is thereafter rapidly cooled down to an amorphous state, increasing resistance value (85 kΩ). In the cell which has been applied with the low-resistance state attaining pulse, when the phase change random access memory element PE continues to be heated by the heater element HE for some time so that the element PE has a temperature which is above a re-crystallization temperature, it changes from the amorphous state to the multi-crystal state, reducing a resistance value (2 kΩ). The cell which has been applied with 0V does not change its state regardless of whether it is in the amorphous state or in the multi-crystal state. In other words, the data already written is not overwritten and held (NOP: no operation).

Figure 12:
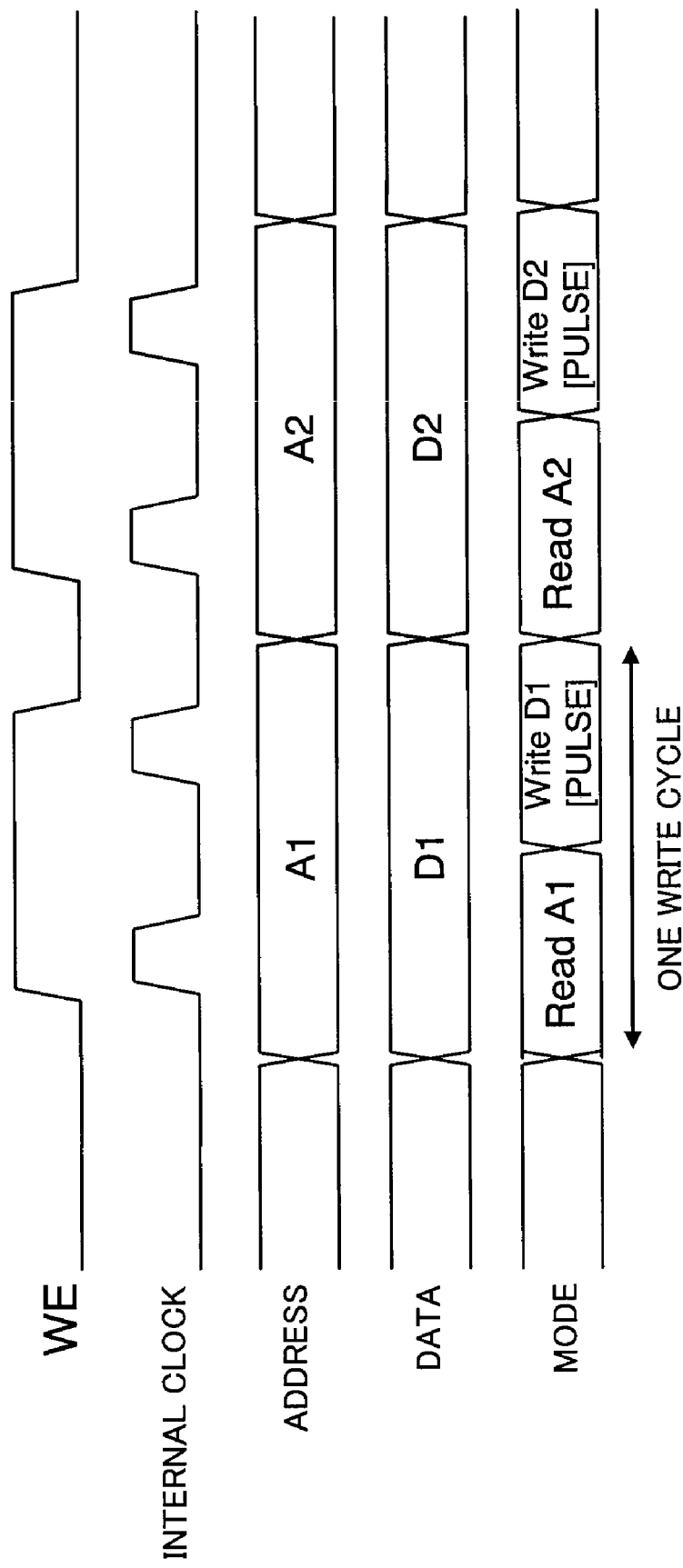
FIG. 12 is a timing chart showing a write operation of the phase change random access memory apparatus according to Comparative example.

FIG. 12 is a timing chart showing the write operation of the phase change random access memory apparatus according to Comparative example. As shown in FIG. 12, in each write cycle, the write enable WE, the write address AD and the data are input. In one write cycle, two internal clocks are generated. The data already written to the phase change random access memory element corresponding to write address AD is read (ReadAx (X=0, 1, 2, . . . ) in synchronization with a first internal clock. Concurrently with this, the data comparison/determination circuit 3 determines whether or not the read data matches the data to be written to a specified address AD. If it is determined that the read data and the write data do not match, a predetermined write pulse (high-resistance state attaining current pulse or low-resistance state attaining current pulse) is applied to a specified cell in synchronization with a subsequent internal clock, and the data is written thereto (Write DX (X=0, 1, 2, . . . )). If it is determined that the read and the write data match, no current pulse is applied (NOP), and overwrite does not take place. In this comparative example, to solve a failure in the write operation due to overwrite, the read operation and the write operation sequentially occur in one write cycle. As can be seen from FIG. 11, according to Comparative example, one write cycle is long. Having described the example in which the nonvolatile memory element is the phase change random access memory element, the same applies to the resistive random access memory element.

Embodiment 2

The nonvolatile memory element 100 of Embodiment 1 is configured to perform the writing in which the data is read in advance, while a nonvolatile memory apparatus 200 of Embodiment 2 is configured to perform so-called "verify write" in addition to the writing in which the data is read in advance. As used herein, the term "verify write" means an operation in which after data is written to a memory element, the data held in the memory element is read for verification, the read data is compared to the write data, and writing is performed again if the read data and the write data do not match.

Figure 13:
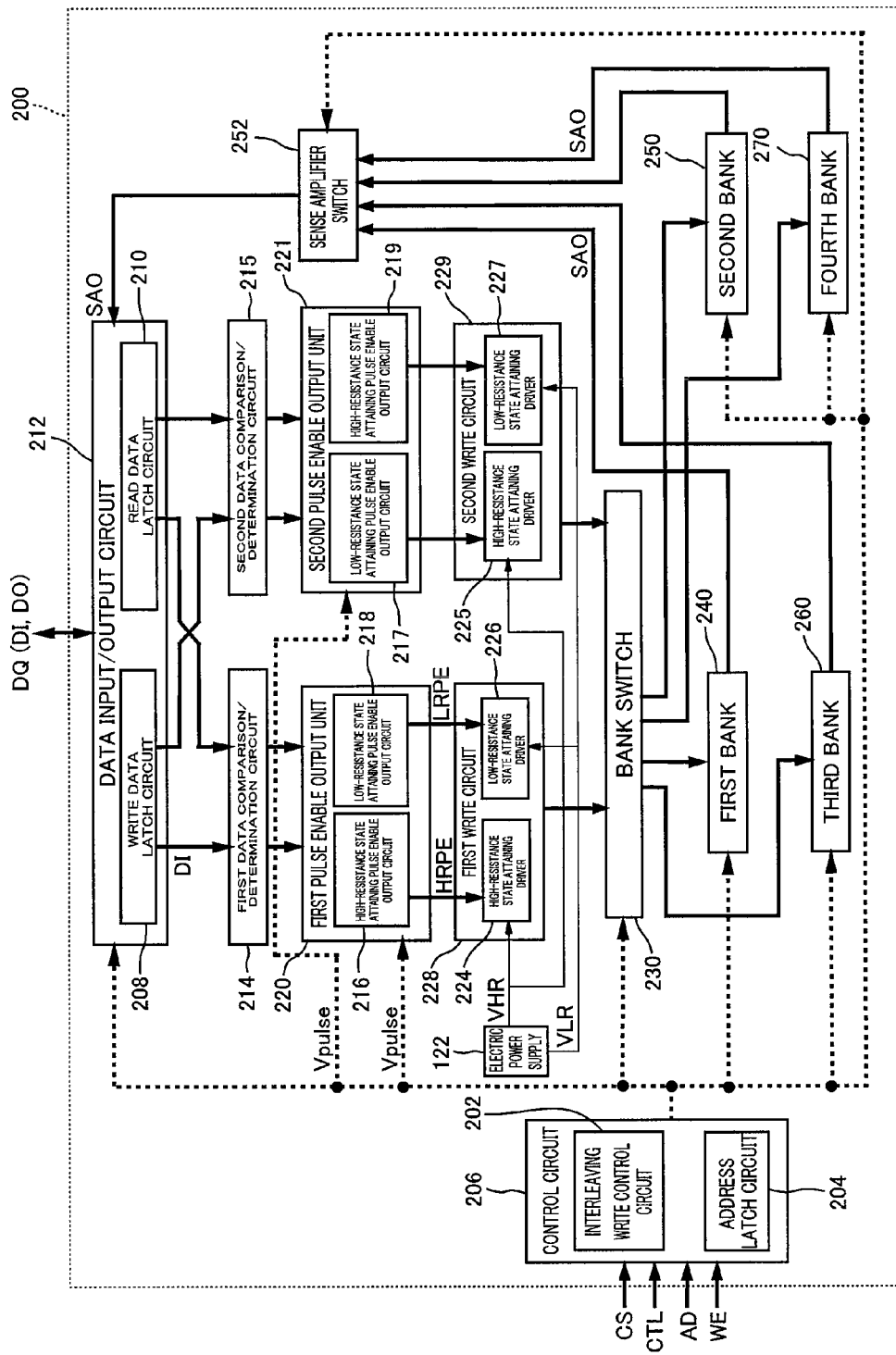
FIG. 13 is a block diagram showing a schematic configuration of a nonvolatile memory apparatus according to Embodiment 2 of the present invention.

FIG. 13 is a block diagram showing a schematic configuration of the nonvolatile memory apparatus according to Embodiment 2 of the present invention. Hereinafter, with reference to FIG. 13, the nonvolatile memory apparatus 200 of this embodiment will be described. The nonvolatile memory apparatus 200 comprises a control circuit 206 including an interleaving write control circuit 202 and an address latch circuit 204, a data input/output circuit 212 including a write data latch circuit 208 and a read data latch circuit 210, a first data comparison/determination circuit 214, a second data comparison/determination circuit 215, a first pulse enable output unit 220 including a high-resistance state attaining pulse enable output circuit 216 and a low-resistance state attaining pulse enable output circuit 218, a second pulse enable output unit 221 including a high-resistance state attaining pulse enable output circuit 217 and a low-resistance state attaining pulse enable output circuit 219, an electric power supply 122, a first write circuit 228 including a high-resistance state attaining driver 224 and a low-resistance state attaining driver 226, a second write circuit 229 including a high-resistance state attaining driver 225 and a low-resistance state attaining driver 227, a bank switch 230 (write switch), a first bank 240 (first memory cell array), a second bank 250 (second memory cell array), a third bank 260 (third memory cell array), a fourth bank 270 (fourth memory cell array), and a sense amplifier switch 252 (read switch). In this embodiment, a comparator/determiner portion includes the first data comparison/determination circuit 214 and the second data comparison/determination circuit 215, a pulse enable output unit includes the first pulse enable output unit 220 and the second pulse enable output unit 221, and a write portion includes a first write circuit 228 and a second write circuit 229.

A control section of the nonvolatile memory apparatus 200 includes the control circuit 206, the data input/output circuit 212, the first data comparison/determination circuit 214, the second data comparison/determination circuit 215, the first pulse enable output unit 220, the second pulse enable output unit 221, the first write circuit 228, the second write circuit 229, the bank switch 230, and the sense amplifier switch 252.

The address latch circuit 204 holds (temporarily holds) address data contained in an address signal. The address latch circuit 204 includes an address latch for the first bank (AL1), an address latch for the second bank (AL2), an address latch for the third bank (AL3), and an address latch for the fourth bank (AL4). The write data latch circuit 208 includes a write data latch for the first bank (DL1), a write data latch for the second bank (DL2), a write data latch for the third bank (DL3), and a write data latch for the fourth bank (DL4). The read data latch circuit 210 includes a read data latch for the first bank (RL1), a read data latch for the second bank (RL2), a read data latch for the third bank (RL3), and a read data latch for the fourth bank (RL4). Since the configurations of the interleaving write control circuit 202, the control circuit 206, and the data input/output circuit 212 are identical to those of Embodiment 1 except for the configuration of the latches and the operation described later, they will not be described in detail.

Since the configuration of the first data comparison/determination circuit 214 (data comparison/determination circuit for first write) and the configuration of the second data comparison/determination circuit 215 (data comparison/determination circuit for second write) are similar to that of the data comparison/determination circuit 114, they will not be further described in detail. Since the configuration of the first pulse enable output unit 220 (pulse enable output circuit for first write) and the configuration of the second pulse enable output unit 221 (pulse enable output circuit for second write) are similar to that of the pulse enable output unit 120, they will not be described in detail. Since the configuration of the first write circuit 228 (write circuit for first write) and the configuration of the second write circuit 229 (write circuit for second write) are similar to that of the write circuit 128, they will not be described in detail.

The bank switch 230 connects each of the first write circuit 228 and the second write circuit 229 to one of the banks at specified timings based on the control of the control circuit 206. The bank switch 230 is configured to connect the write circuits to the banks independently. For example, when the write circuit 228 writes data to the first bank 240 and the second write circuit 229 writes data to the third bank 260 such that writing of these data occurs concurrently, the first write circuit 228 is connected to the first bank 240 and the second write circuit 229 is connected to the third bank 260.

The sense amplifier switch 252 connects the data input/output circuit 212 to the associated banks at specified timings based on the control of the control circuit 206. The sense amplifier switch 252 is configured to independently connect the banks to the individual latches included in the read data latch of the data input/output circuit 212. For example, in the case where data is read from the second bank 250 and from the fourth bank 270 concurrently, the read data latch for the second bank (RL2) is connected to the second bank 250 and the data latch for the fourth bank (RL4) is connected to the fourth bank 270.

Since the configuration of the first bank 240, the configuration of the second bank 250, the configuration of the third bank 260, and the configuration of the fourth bank 270 are similar to those of the first bank 140 and the second bank 150 in Embodiment 1, they will not be further described.

Operation

Hereinafter, the operation of the nonvolatile memory apparatus 200 will be described. In this embodiment, writing in which data is read in advance (FIG. 7) is performed, and then writing in which data is read for verification is performed.

The interleaving write of this embodiment is identical to that of Embodiment 1 in that data is written to a memory cell array and data is read from another memory cell array such that writing of the data and reading of the data occur concurrently, as in Embodiment 1. But, the interleaving write of this embodiment is different from that of Embodiment 1 in that data is written to two memory cell arrays concurrently and data is read from two memory cell arrays such that writing of the data an reading of the data occur concurrently. After writing is performed, it is verified whether or not the data stored in the associated nonvolatile memory element has changed as intended, and writing is performed again if write error is present. For the four memory cell arrays, reading and writing occur concurrently and are each performed twice for each cell array such that reading and writing occur alternately in the periods. Such control makes it possible to hide the latency required for first read (read in advance), first write, and second read (read for verification). Therefore, reading in advance and reading for verification are performed with a write speed improved as a whole.

Subsequently, the detail of the write operation under the interleaving control of this embodiment will be described. FIG. 14 is a table showing an example of signals and others in each period in Embodiment 2 of the present invention. As shown in FIG. 14, for each period, DI and AD input externally, the value of SAO associated with reading in advance (value of reading in advance: SAOR), the value of SAO (value of verify reading: SAOV) associated with verify reading, the values stored in the write data latch circuit 208 (write data latch for the first bank (DL1), write data latch for the second bank (DL2), write data latch for the third bank (DL3), write data latch for the fourth bank (DL4)) in the data input/output circuit 212, the values stored in the read data latch circuit 210 (read data latch for the first bank (RL1), read data latch for the second bank (RL2), read data latch for the third bank (RL3), read data latch for the fourth bank (RL4)) in the data input/output circuit 212, the values stored in the address latch circuit 204 (address latch for the first bank (AL1), address latch for the second bank (AL2), address latch for the third bank (AL3), address latch for the fourth bank (AL4)) in the control circuit 206, addresses in the first bank 240 for which the write operation and the read operation occur, addresses in the second bank 250 for which the write operation and the read operation occur, addresses in the third bank 260 for which the write operation and the read operation occur, and addresses in the fourth bank 270 for which the write operation and the read operation occur. In this embodiment, the address having address data whose least significant two bits are "00" is assigned to the first bank 240, the address having address data whose least significant two bits are "01" is assigned to the second bank 250, the address having address data whose least significant two bits are "10" is assigned to the third bank 260, and the address having address data whose least significant two bits are "11" is assigned to the fourth bank 270. That is, the addresses are assigned to the nonvolatile memory elements in the associated memory cell arrays so that the nonvolatile memory elements corresponding to four consecutive addresses are included in different memory cell arrays. Hereinafter, it is supposed that the input addresses are consecutive. Each operation is performed based on the control of the control circuit 206 (interleaving write control circuit 202). The writing of data starts upon address data and write data being input when the chip select CS is H and the write enable WE is H.

In a first period, primarily, data is read from a memory cell corresponding to an address input in this period. Since the operation is similar to that in Embodiment 1, it will not be described in detail.

In a second period, primarily, data is read from a memory cell corresponding to an address input in this period and data is written to the memory cell corresponding to the address input in the first period. The write data and the read data are respectively input from the write data latch circuit 208 and the read data latch circuit 210 to the first data comparison/determination circuit 214, a determination result is sent to the first pulse enable output unit 220, and the first write circuit 228 is driven to write data. Specific operation is identical to that of Embodiment 1, and will not be described in detail.

In a third period, primarily, data is read from a memory cell corresponding to an address input in this period, data is written to the memory cell corresponding to the address input in the period (second period) which is one period before the third period, and the data is read from the memory cell corresponding to the address input in the period (third period) which is two periods before the third period. Suppose that the value input as AD in the third period is A3 and the value input as DI in the third period is D3. Since the input addresses are consecutive, the bank corresponding to A3 is the third bank 260. A3 is stored in the address latch for the third bank (AL3), and D3 is stored in the write data latch for the third bank (DL3). The sense amplifier switch 252 is switched to connect the first bank 240 and the third bank 260 to the data input/output circuit 212. To be specific, the read data latch for the first bank (RL1) is connected to the sense amplifier in the first bank 240, and the read data latch for the third bank (RL3) is connected to the sense amplifier in the third bank 260. The bank switch 230 is switched to connect the first write circuit 228 to the second bank 250. A resistance state of the memory cell (memory cell in third bank) whose address is A3 is read. When the value of the read SAOR (read data of the third bank) is R3, R3 is stored in the read data latch for the third bank (RL3). D2 stored in the write data latch for the second bank DL2 and R2 stored in the read data latch for the second bank (RL2) are input to the first data comparison/determination circuit 214. The first pulse enable output unit 220 and the first write circuit 228 operate in association with each other and the electric pulse is output to the second bank 250 if a predetermined condition is met (see FIG. 3). D2 stored in the write data latch for the second bank DL2 is also sent to the control circuit 206. The control circuit 206 controls the column decoder in the second bank based on D2 received. In the second bank 250, the memory cell corresponding to A2 stored in the address latch for the second AL2 is activated by the row decoder and the column decoder, and the electric pulse is applied to the nonvolatile memory element included in the memory cell to write data thereto. When D2 is "0" and R2 is "1," the column decoder selects a bit line corresponding to the memory cell and the high-resistance state attaining pulse is applied to the memory cell (PULSE). When D2 is "1" and R2 is "0," the column decoder selects a source line corresponding to the memory cell, and the low-resistance state attaining pulse is applied to the memory cell (PULSE). When D2 is equal to R2, HRPE and LRPE remain L, and no electric pulse is output (NOP). A resistance state of a memory cell (memory cell in the first bank) whose address is A1 is read. When the value of the read SAOR (read data of the first bank) is V1, V1 is stored in the read data latch for the first bank (RL1). Accordingly, the value stored in the read data latch for the first bank (RL1) is updated.

In a fourth period, primarily, data is read from a memory cell corresponding to an address input in this period, data is written to the memory cell corresponding to the address input in the period (third period) which is one period before the fourth period, data is read from the memory cell corresponding to the address input in the period (second period) which is two periods before the fourth period, and data is written to the memory cell corresponding to the address input in the period (first period) which is three periods before the fourth period. Suppose that the value input as AD in the fourth period is A4 and the value input as DI in the fourth period is D4. Since the addresses input are consecutive, the bank corresponding to A4 is the fourth bank 270. A4 is stored in the address latch for the fourth bank (AL4), and D4 is stored in the write data latch for the fourth bank (DL4). The sense amplifier switch 252 is switched to connect the second bank 250 and the fourth bank 270 to the data input/output circuit 212. To be specific, the read data latch for the second bank (RL2) is connected to the sense amplifier in the second bank 250, and the read data latch for the fourth bank (RL4) is connected to the sense amplifier in the fourth bank 270. The bank switch 230 is switched to connect the first write circuit 228 to the third bank 260 and to connect the second write circuit 229 to the first bank 240. A resistance state of the memory cell (memory cell in the fourth bank) whose address is A4 is read. When the value of the read SAOR (read data of the fourth bank) is R4, R4 is stored in the read data latch for the fourth bank (RL4). D3 stored in the write data latch for the third bank (DL3) and R3 stored in the read data latch for the third bank (RL3) are input to the data comparison/determination circuit 214. The first pulse enable output unit 220 and the first write circuit 228 operate in association with each other and the electric pulse is output to the third bank 260 if a predetermined condition is met (see FIG. 3). D3 stored in the write data latch for the third bank (DL3) is also sent to the control circuit 206. The control circuit 206 controls the column decoder in the third bank based on D3 received. In the third bank 260, the memory cell corresponding to A3 stored in the address latch for the third bank (AL3) is activated by the row decoder and the column decoder, and the electric pulse is applied to the nonvolatile memory element included in the memory cell to write data thereto. When D3 is "0" and R3 is "1," the column decoder selects a bit line corresponding to the memory cell and the high-resistance state attaining pulse is applied to the memory cell (PULSE). When D3 is "1" and R3 is "0," the column decoder selects a source line corresponding to the memory cell and the low-resistance state attaining pulse is applied to the memory cell (PULSE). When D3 is equal to R3, HRPE and LRPE remain L, and no electric pulse is output (NOP). A resistance state of a memory cell (memory cell in the second bank) whose address is A2 is read. When the value of the read SAOV (read data of the second bank) is V2, V2 is stored in the read data latch for the second bank (RL2). Accordingly, the value stored in the read data latch for the second bank (RL2) is updated. D1 stored in the write data latch for the first bank (DL1) and V1 stored in the read data latch for the first bank (RL1) are input to the second data comparison/determination circuit 215. The second pulse enable output unit 221 and the second write circuit 229 operate in association with each other and the electric pulse is output to the first bank 240 if a predetermined condition is met (see FIG. 3). D1 stored in the write data latch for the first bank (DL1) is also sent to the control circuit 206. The control circuit 206 controls the column decoder in the first bank based on D1 received. In the first bank 240, the memory cell corresponding to A1 stored in the address latch for the first bank (AL1) is activated by the row decoder and the column decoder, and the electric pulse is applied to the nonvolatile memory element included in the memory cell to write data thereto. When D1 is "0" and R1 is "1," the column decoder selects a bit line corresponding to the memory cell and the high-resistance state attaining pulse is applied to the memory cell (PULSE). When D1 is "1" and R1 is "0," the column decoder selects a source line corresponding to the memory cell and the low-resistance state attaining pulse is applied to the memory cell (PULSE). When D1 is equal to V1, HRPE and LRPE remain L, and no electric pulse is output (NOP).

In a fifth period, primarily, data is read from a memory cell corresponding to an address input in this period, data is written to the memory cell corresponding to the address input in the period (fourth period) which is one period before the fifth period, data is read from the memory cell corresponding to the address input in the period (third period) which is two periods before the fifth period, and data is written to the memory cell corresponding to the address input in the period (second period) which is three periods before the fifth period. Suppose that the value input as AD in the fifth period is A5 and the value input as DI in the fifth period is D5. Since the addresses input are consecutive, the bank corresponding to A5 is the first bank 240. A5 is stored in the address latch for the first bank (AL1), and D5 is stored in the write data latch for the first bank (DL1). Accordingly, the value stored in the address latch for the first bank (AL1) and the value stored in the write data latch for the first bank (DL1) are updated. The sense amplifier switch 252 is switched to connect the first bank 240 and the third bank 260 to the data input/output circuit 212. To be specific, the read data latch for the first bank (RL1) is connected to the sense amplifier in the first bank 240, and the data latch for the third bank (RL3) is connected to the sense amplifier in the third bank 260. The bank switch 230 is switched to connect the first write circuit 228 to the fourth bank 270, and to connect the second write circuit 229 to the second bank 250. A resistance state of the memory cell (memory cell in first bank) whose address is A5 is read. When the value of the read SAOR (read data of the first bank) is R5, R5 is stored in the read data latch for the first bank (RL1). Accordingly, the value stored in the read data latch for the first bank (RL1) is updated. D4 stored in the write data latch for the fourth bank (DL4) and R4 stored in the read data latch for the fourth bank (RL4) are input to the first data comparison/determination circuit 214. The first pulse enable output unit 220 and the first write circuit 228 operate in association with each other and the electric pulse is output to the fourth bank 270 if a predetermined condition is met (see FIG. 3). D4 stored in the write data latch for the fourth bank (DL4) is also sent to the control circuit 206. The control circuit 206 controls the column decoder in the fourth bank based on D4 received. In the fourth bank 270, the memory cell corresponding to A4 stored in the address latch for the fourth bank (AL4) is activated by the row decoder and the column decoder, and the electric pulse is applied to the nonvolatile memory element included in the memory cell to write data thereto. When D4 is "0" and R4 is "1," the column decoder selects a bit line corresponding to the memory cell and the high-resistance state attaining pulse is applied to the memory cell (PULSE). When D4 is "1" and R4 is "0," the column decoder selects a source line corresponding to the memory cell and the low-resistance state attaining pulse is applied to the memory cell (PULSE). When D4 is equal to R4, HRPE and LRPE remain L, and no electric pulse is output (NOP). A resistance state of the memory cell (memory cell in the third bank) whose address is A3 is read. When the value of the read SAOV (read data of the third bank) is V3, V3 is stored in the read data latch for the third bank (RL3). Accordingly, the value stored in the read data latch for the third bank (RL3) is updated. D2 stored in the write data latch for the second bank (DL2) and V2 stored in the read data latch for the second bank (RL2) are input to the second data comparison/determination circuit 215. The second pulse enable output unit 221 and the second write circuit 229 operate in association with each other and the electric pulse is output to the second bank 250 if a predetermined condition is met (see FIG. 3). D2 stored in the write data latch for the second bank (DL2) is also sent to the control circuit 206. The control circuit 206 controls the column decoder in the second bank based on D2 received. In the second bank 250, the memory cell corresponding to A2 stored in the address latch for the second bank (AL2) is activated by the row decoder and the column decoder, and the electric pulse is applied to the nonvolatile memory element included in the memory cell to write the data thereto. When D2 is "0" and R2 is "1," the column decoder selects a bit line corresponding to the memory cell and the high-resistance state attaining pulse is applied to the memory cell (PULSE). When D2 is "1" and R2 is "0," the column decoder selects a source line corresponding to the memory cell and the low-resistance state attaining pulse is applied to the memory cell (PULSE). When D2 is equal to V2, HRPE and LRPE remain L, and no electric pulse is output (NOP).

The operation in the sixth period and the following periods are similar to those of the fifth period except for the associated banks and reference numbers and will not be descried (see FIG. 14).

Figure 15:
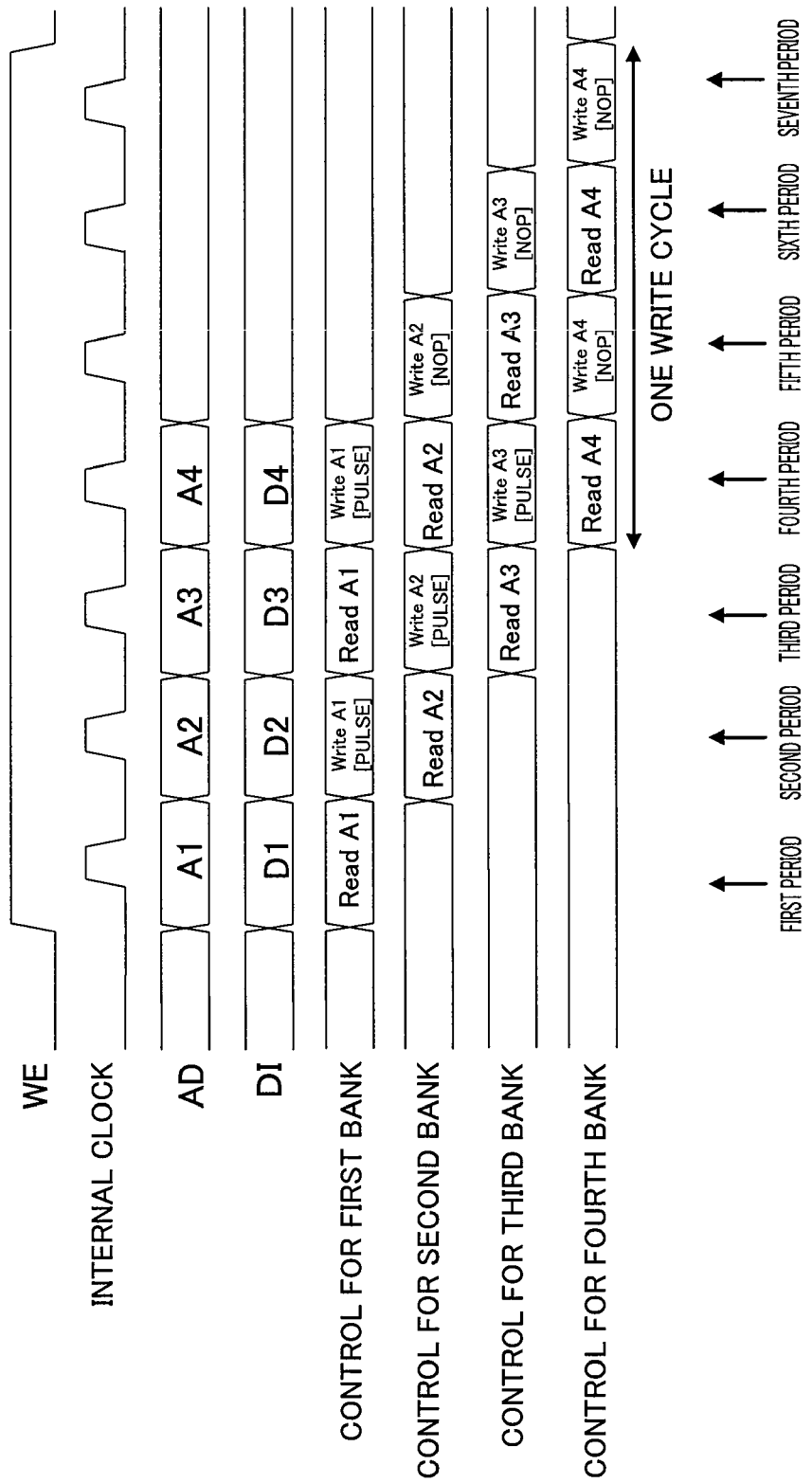
FIG. 15 is an example of a timing chart of interleaving write which is performed by the nonvolatile memory apparatus according to Embodiment 1 of the present invention.
Figure 16:
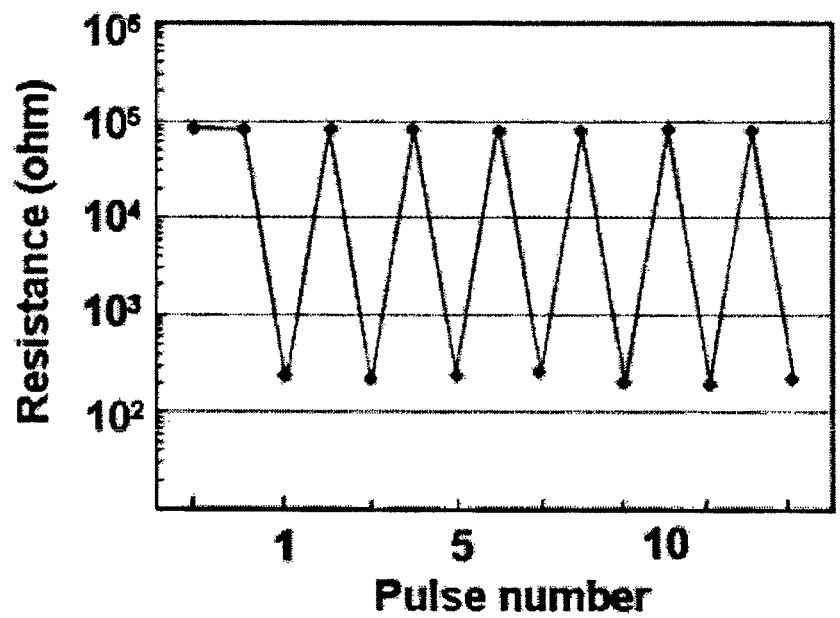
FIG. 16 is a view showing change in a resistance state in a case where a positive pulse and a negative pulse are applied alternately to a resistive random access memory apparatus disclosed in non-patent document 1.
Figure 17:
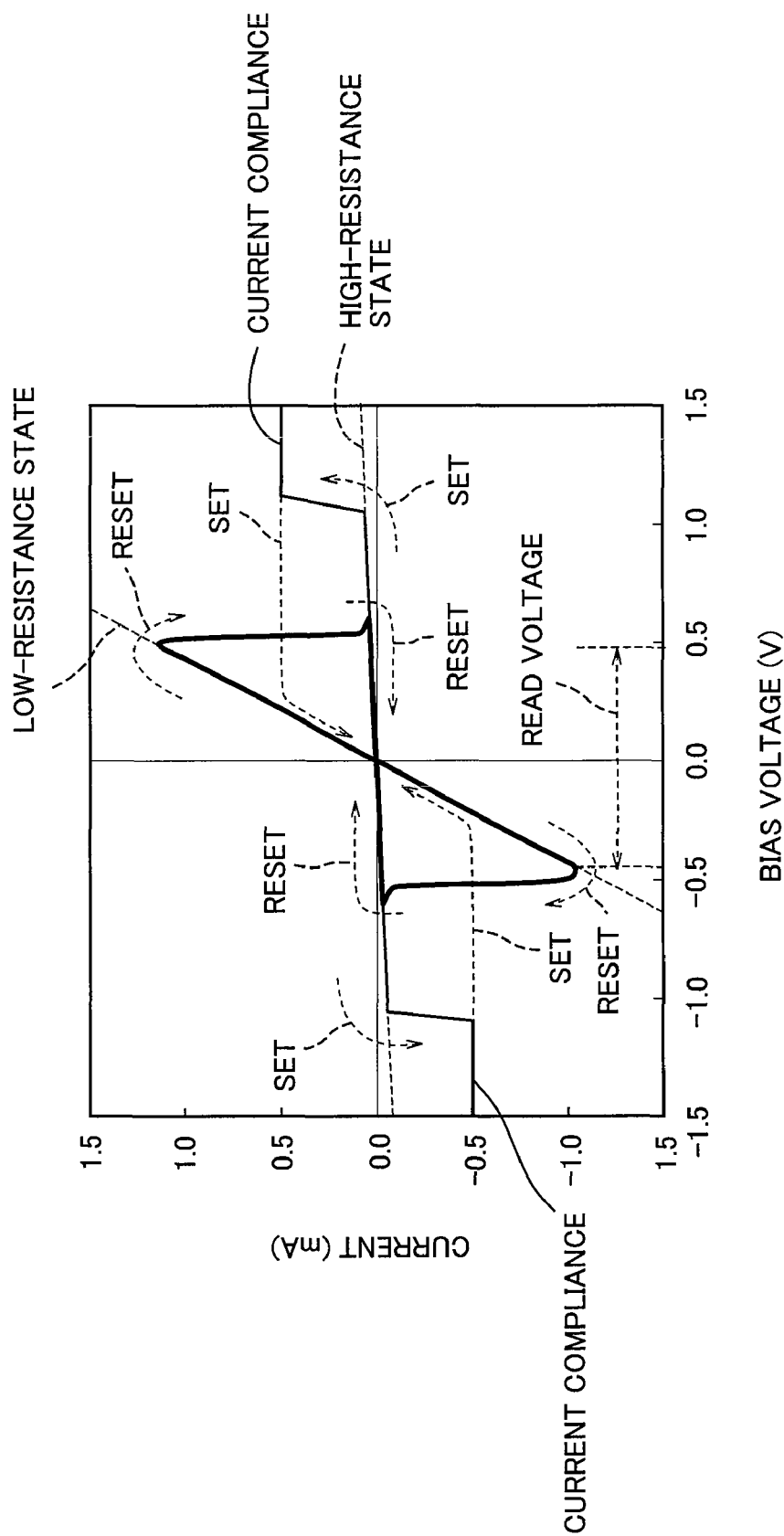
FIG. 17 is a view showing a current-voltage characteristic of a resistance variable element using TMO (transition metal oxide) disclosed in non-patent document 2.

FIG. 15 is an example of a timing chart of interleaving write executed by the nonvolatile memory apparatus according to Embodiment 1 of the present invention.

As shown in FIG. 15, in the first period, A1 is input as address AD, D1 is input as write data, and data written to the memory cell in the first bank corresponding to A1 is read (Read A1).

In the second period, A2 is input as the address AD, D2 is input as write data, data is written to the memory cell in the first bank corresponding to A1 (Write A1), and data written to the memory cell in the second bank corresponding to A2 is read (Read A2). FIG. 15 shows a case where R1 and D1 are different, and the electric pulse is applied to the nonvolatile memory element corresponding to A1.

In the third period, A3 is input as address AD, D3 is input as write data, data written to the memory cell in the first bank corresponding to A1 is read (Read A1), data is written to the memory cell in the second bank corresponding to A2 (Write A2), and data written to the memory cell in the third bank corresponding to A3 is read (Read A3). FIG. 15 shows a case where R2 and D2 are different. Since these data are different, an electric pulse is applied to the nonvolatile memory element corresponding to A2.

In the fourth period, A4 is input as the address AD, D4 is input as write data, data is written to the memory cell in the first bank corresponding to A1 (Write A1), data written to the memory cell in the second bank corresponding to A2 is read (Read A2), data is written to the memory cell in the third bank corresponding to A3 (Write A3), and data written to the memory cell in the fourth bank corresponding to A4 is read (Read A4). In the fourth period, the write cycle (twice reading and twice writing) for the memory cell corresponding to A1 is complete. FIG. 15 shows a case where V1 and D1 are different, R3 and D3 are different, and the electric pulse is applied to the nonvolatile memory elements respectively corresponding to A1 and A3.

In the fifth period and the following periods, in the same manner as described above, writing and reading are performed sequentially and alternately for each bank. The aforesaid operation is also referred to as the interleaving write. As shown in FIG. 15, in an actual write operation, the electric pulse is applied (PULSE) if read data in an immediately preceding period and write data in a current write cycle do not match, but no electric is applied (NOP) if they match. For example, FIG. 15 shows a case where in the fifth period, V2 is equal to D2, R4 is equal to D4, and no electric pulse is applied to the nonvolatile memory elements corresponding to A2 and A4.

As described above, in this embodiment, in the case where data is written to consecutive addresses, writing and reading are performed concurrently sequentially and alternately for the first to fourth banks in successive periods. To be specific, when writing is performed for the first bank and the third bank, reading is performed for the second bank and the fourth bank, while when reading is performed for the first bank and the third bank, writing is performed for the second bank and the fourth bank. In writing, data read in an immediately preceding period is compared to write data, and the electric pulse is applied to the memory cell only when these data do not match. If these data match, no electric pulse is applied to the memory cell. As a result, the high-resistance state attaining pulse is not applied to the memory cell in the high-resistance state, and the low-resistance state attaining pulse is not applied to the memory cell in the low-resistance state.

Furthermore, the resistance state is read again after the electric pulse is applied. Whether or not writing has been performed correctly is verified. If there is an error, the electric pulse is applied again. That is, the data read again is compared to the write data, and the electric pulse is applied to the memory cell if they do not mach. Thus, the electric pulse is applied to the memory cell again, only when the resistance state (read data) of the memory cell does not indicate correct write data. No electric pulse is applied to the memory cell, when the resistance state (read data) of the memory cell indicates the correct write data.

Figure 19:
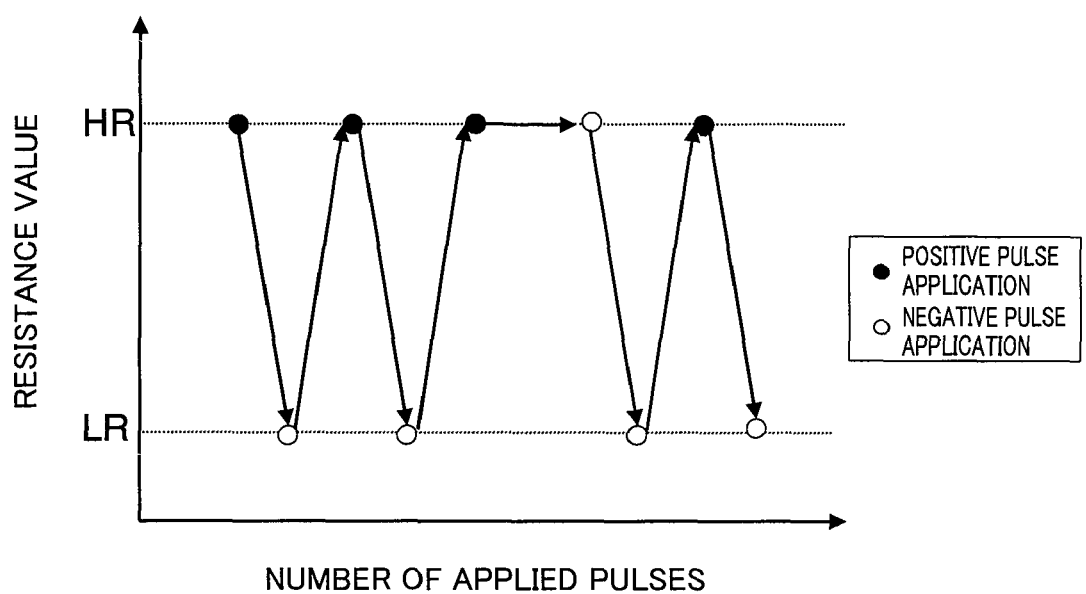
FIG. 19 is a view showing a write failure which occurs accidentally during writing of data in a resistive random access memory element using an iron oxide as a resistance variable material.

The aforesaid control makes it possible to perform the writing in which data is read in advance and data is read for verification without reducing a write speed of data. The verify reading is capable of effectively diminishing occurrence of the problem associated with a write failure (see FIG. 19) which would occur regardless of whether or not the electric pulse is unnecessarily applied. Therefore, data can be surely written while preventing reduction of responsiveness (see FIG. 18) due to the application of the unnecessary electric pulse. As a result, reliability of the memory operation is further improved.

In this embodiment, also, the advantages achieved by Embodiment 1 are achieved, and the similar modification is applicable.

The configuration of this embodiment is capable of effectively diminishing occurrence of the write failure (see FIG. 19) which would occur regardless of whether or not electric pulse is unnecessarily applied. Such a phenomenon tends to be problematic in the resistive random access memory element. Therefore, the configuration of this embodiment is effective particularly to the resistive random access memory apparatus.

Whereas the reading for verification is performed only once in this embodiment, it may be performed twice or more. In such a configuration, desired data can be written more surely. For example, in the case where the reading for verification is performed twice, the number of memory cell arrays may be set to six and data reading and data writing may be performed sequentially in an alternate manner. In the case where the verify reading is performed N times, the number of the memory cell arrays may be set to 2(N+1) and data reading and data writing may be performed sequentially in an alternate manner.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory apparatus of the present invention is useful as a nonvolatile memory apparatus which improves reliability of a write operation without reducing a write speed.

The invention claimed is:

1. A nonvolatile memory apparatus comprising:
a plurality of memory cell arrays each including a plurality of nonvolatile memory elements having a characteristic in which a resistance value thereof changes according to electric pulses applied; and
a control section which is configured to, in writing of data for the plurality of memory cell arrays, write data to a memory cell array and read data from another memory cell array such that writing of the data and reading of the data occur concurrently;
wherein the control section includes:
an address latch for temporarily holding address data input externally;
a read data latch for temporarily holding read data which has been read from a nonvolatile memory element corresponding to the address data input externally;
a write data latch for temporarily holding write data input externally;
a comparator/determiner portion for comparing the write data held in the write data latch to the read data held in the read data latch;
a write portion for inputting an electric pulse to the memory cell array, based on a determination result output from the comparator/determiner portion;
a write switch for connecting the write portion to a specified memory cell array;
a read switch for connecting the read data latch to a specified memory cell array; and
an interleaving write control circuit which is configured to control the write switch to connect the write portion to a specified memory cell array at a specified timing and control the read switch to connect the read data latch to a specified memory cell array at a specified timing.

2. The nonvolatile memory apparatus according to claim 1, wherein the nonvolatile memory element is a resistive random access memory element.

3. The nonvolatile memory apparatus according to claim 1, wherein the nonvolatile memory element is a phase change random access memory element.

4. The nonvolatile memory element apparatus according to claim 1, wherein
the interleaving write control circuit is configured to, prior to writing of data to a nonvolatile memory element corresponding to an address in writing of data to consecutive addresses, hold address data input externally in the address latch, hold write data input externally in the write data latch, control the read switch to connect the read data latch to a memory cell array including the nonvolatile memory element corresponding to the address data, read data stored in the nonvolatile memory element and hold the read data in the read data latch, then cause the comparator/determiner portion to compare the data stored in the read data latch to the data stored in the write data latch, control the write switch to connect the write portion to the memory cell array to cause the data stored in the write data latch to be written to the nonvolatile memory element and cause the write portion to output an electric pulse, only when the data stored in the read data latch and the data stored in the write data latch do not match.

5. The nonvolatile memory apparatus according to claim 1,
wherein the memory cell arrays are two in number;
wherein the addresses are respectively assigned to the memory cell arrays such that nonvolatile memory elements corresponding to two consecutive addresses are included in different memory cell arrays;
wherein the interleaving write control circuit is configured to,
in each period other than a first period, among periods which are set as time units during which writing or reading of data is performed for each address, in writing of the data to the consecutive addresses,
hold in the address latch, address data input externally in the each period, hold in the write data latch, write data input externally in the each period, control the read switch to connect the read data latch to a memory cell array including a nonvolatile memory element corresponding to the address data input externally in the each period, read data stored in the nonvolatile memory element corresponding to the address data input externally in the each period and hold the data as the read data in the read data latch; wherein the interleaving write control circuit is configured to, control the write switch to connect the write portion to a memory cell array including a nonvolatile memory element corresponding to address data input externally in an immediately preceding period, cause the read data latch to output read data which has been read from the nonvolatile memory element corresponding to the address data input externally in the immediately preceding period to the comparator/determiner portion and the write data latch to output write data which has been input externally in the immediately preceding period to the comparator/determiner portion, and cause the write portion to output the electric pulse to write the write data input in the immediately preceding period to the nonvolatile memory element corresponding to the address data input externally in the immediately preceding period, only when the write data and the read data do not match, based on a determination result output from the comparator/determiner portion.

6. The nonvolatile memory apparatus according to claim 1,
wherein the memory cell arrays are four in number;
wherein the addresses are respectively assigned to the memory cell arrays such that nonvolatile memory elements corresponding to four consecutive addresses are included in different memory cell arrays;
wherein the write portion includes a first write circuit and a second write circuit;
wherein the interleaving write control circuit is configured to,
in each period other than first three periods, among periods which are set as time units during which writing or reading of data is performed for each address, in writing of the data to the consecutive addresses,
hold in the address latch, address data input externally in the each period, hold in the write data latch, write data input externally in the each period, control the read switch to connect the read data latch to a memory cell array including a nonvolatile memory element corresponding to the address data input externally in the each period, read data stored in a nonvolatile memory element corresponding to the address data input externally in the each period and hold the data as the read data in the read data latch;
wherein the interleaving write control circuit is configured to, control the write switch to connect the first write circuit to a memory cell array including a nonvolatile memory element corresponding to address data input externally in an immediately preceding period, cause the read data latch to output read data which has been read in the immediately preceding period from the nonvolatile memory element corresponding to the address data input externally in the immediately preceding period to the comparator/determiner portion and the write data latch to output write data which has been input externally in the immediately preceding period to the comparator/determiner portion, and cause the first write circuit to output the electric pulse to write the write data input in the immediately preceding period to the nonvolatile memory element corresponding to the address data input externally in the immediately preceding period, only when the read data and the write data do not match, based on a determination result output from the comparator/determiner portion;
wherein the interleaving write control circuit is configured to, control the read switch to connect the read data latch to a memory cell array including a nonvolatile memory element corresponding to address data input externally in a preceding period which is two periods before the each period, read the data stored in the nonvolatile memory element corresponding to the address data input externally in the preceding period which is two periods before the each period and hold the data as the read data in the read data latch;
wherein the interleaving write control circuit is configured to, control the write switch to connect the second write circuit to a memory cell array including a nonvolatile memory element corresponding to address data input externally in a preceding period which is three periods before the each period, cause the read data latch to output to the comparator/determiner portion read data which has been read in the immediately preceding period from the nonvolatile memory element corresponding to the address data input externally in the preceding period which is three periods before the each period and the write data latch to output to the comparator/determiner portion write data which has been input externally in the preceding period which is three periods before the each period, and cause the second write circuit to output the electric pulse to write the write data input in the preceding period which is three periods before the each period, to the nonvolatile memory element corresponding to the address data input externally in the preceding period which is three periods before the each period, only when the read data and the write data do not match, based on a determination result output from the comparator/determiner portion.

7. The nonvolatile memory apparatus according to claim 1, wherein the nonvolatile memory element is configured to change a resistance value thereof according to an accumulated application amount of an energy having a predetermined form; and
wherein the write portion is configured to apply the energy having the predetermined form to change the resistance value of the nonvolatile memory element.

8. The nonvolatile memory apparatus according to claim 7, wherein the accumulated application amount of the energy having the predetermined form is an accumulated application amount of the electric pulse; and
wherein the write portion is configured to apply the electric pulse to the nonvolatile memory element to change the resistance value of the nonvolatile memory element.

9. A method of writing data to a nonvolatile memory apparatus including:
a plurality of memory cell arrays each including a plurality of nonvolatile memory elements having a characteristic in which a resistance value thereof changes according to electric pulses applied; and
a control section which is configured to, in writing of data for the plurality of memory cell arrays, write data to a memory cell array and read data from another memory cell array such that writing of the data and reading of the data occur concurrently;
wherein the control section includes:
an address latch for temporarily holding address data input externally;
a read data latch for temporarily holding read data which has been read from a nonvolatile memory element corresponding to the address data input externally;
a write data latch for temporarily holding write data input externally;
a comparator/determiner portion for comparing the write data held in the write data latch to the read data held in the read data latch;
a write portion for inputting an electric pulse to the memory cell array, based on a determination result output from the comparator/determiner portion;
a write switch for connecting the write portion to a specified memory cell array;
a read switch for connecting the read data latch to a specified memory cell array; and
an interleaving write control circuit which is configured to control the write switch to connect the write portion to a specified memory cell array at a specified timing and control the read switch to connect the read data latch to a specified memory cell array at a specified timing;
wherein in writing of the data to the plurality of memory cell arrays, the data is written to a memory cell array and data is read from another memory cell array such that writing of data and reading of data occur concurrently; the method comprising: using the interleaving write control circuit;
prior to writing data to a nonvolatile memory element corresponding to an address in writing of the data to consecutive addresses;
holding in the address latch address data input externally;
holding in the write data latch write data input externally;
controlling the read switch to connect the read data latch to a memory cell array including a nonvolatile memory element corresponding to the address data;
reading data stored in the nonvolatile memory element and holding the data in the read data latch;
then causing the comparator/determiner portion to compare the data stored in the read data latch to the data stored in the write data latch;
only when the read data and the write data do not match, controlling the write switch to connect the write portion to the memory cell array to write the data stored in the write data latch to the nonvolatile memory element; and
causing the write portion to output the electric pulse.

10. The method of writing data to the nonvolatile memory apparatus according to claim 9, in which the addresses are respectively assigned to the memory cell arrays such that nonvolatile memory elements corresponding to two consecutive addresses are included in different memory cell arrays, the method further comprising:
in each period other than a first period, among periods which are set as time units during which writing or reading of data is performed for each address, in writing of the data to the consecutive addresses,
holding address data input externally in the each period and holding write data input externally in the each period;
reading data stored in a nonvolatile memory element corresponding to the address data input externally in the each period and holding the data as read data;
comparing write data which has been input externally and held in an immediately preceding period to read data which has been read and held in the immediately preceding period; and
applying the electric pulse to write the write data which has been input externally and held in the immediately preceding period to a nonvolatile memory element corresponding to address data which has been input externally and held in the immediately preceding period, only when the read data and the write data do not match.

11. The method of writing data to the nonvolatile memory apparatus according to claim 9, in which the memory cell arrays are four or more in number and the addresses are respectively assigned to the memory cell arrays such that nonvolatile memory elements corresponding to four consecutive addresses are included in different memory cell arrays; the method further comprising:
in each period other than first three periods, among periods which are set as time units during which writing or reading of data is performed for each address, in writing of the data to the consecutive addresses,
holding address data input externally in the each period and holding write data input externally in the each period;
reading data stored in a nonvolatile memory element corresponding to the address data input externally in the each period and holding the data as read data;
comparing write data which has been input externally and held in an immediately preceding period to read data which has been read and held in the immediately preceding period;
applying the electric pulse to write the write data which has been input externally and held in the immediately preceding period to a nonvolatile memory element corresponding to address data which has been input externally and held in the immediately preceding period, only when the read data and the write data do not match;

reading data stored in a nonvolatile memory element corresponding to address data input externally in a preceding period which is two periods before the each period and holding the data as read data;

comparing write data which has been input externally and held in a preceding period which is three periods before the each period to the read data which has been read and held in the immediately preceding period from a nonvolatile memory element corresponding to address data input externally in the preceding period which is three periods before the each period; and applying the electric pulse to write the write data which has been input externally and held in the preceding period which is three periods before the each period to the nonvolatile memory element corresponding to the address data which has been input externally and held in the preceding period which is three periods before the each period, only when the read data and the write data do not match.

12. The method of writing data to the nonvolatile memory apparatus according to claim 9, the nonvolatile memory apparatus including a plurality of memory cell arrays each including nonvolatile memory elements whose resistance values change according to electric pulses applied, in which data is written to a memory cell array and data is read from another memory cell array such that writing of the data and reading of the data occur concurrently in writing of the data to the plurality of memory cell arrays, the method comprising:

in writing of the data to each of the memory cell arrays,
holding address data input externally in a first period and holding write data input externally in the first period;
reading data stored in a nonvolatile memory element corresponding to the address data input externally in the first period and holding the data as read data;
comparing the write data to the read data;
in a second period which is subsequent to the first period, applying the electric pulse to write the write data to a nonvolatile memory element corresponding to the address data which has been input externally and held in the first period which is an immediately preceding period of the second period;
in a third period which is subsequent to the second period, reading data from the nonvolatile memory element which has been applied with the electric pulse and holding the data as read data;
comparing the write data to the read data;
applying the electric pulse to write the write data to the nonvolatile memory element in a fourth period which is subsequent to the third period only when the write data and the read data do not match; and
repeating a read and determination operation and a write operation until the read data of the nonvolatile memory element which has been applied with the electric pulse and the write data match.

* * * * *